(12) United States Patent
Ueno et al.

(10) Patent No.: US 9,300,885 B2
(45) Date of Patent: Mar. 29, 2016

(54) IMAGING DEVICE, PORTABLE INFORMATION TERMINAL, AND IMAGING SYSTEM

(71) Applicant: Kabushiki Kaisha Toshiba, Minato-ku (JP)

(72) Inventors: Risako Ueno, Tokyo (JP); Hiroto Honda, Yokohama (JP); Mitsuyoshi Kobayashi, Tokyo (JP); Kazuhiro Suzuki, Tokyo (JP); Honam Kwon, Kawasaki (JP); Hideyuki Funaki, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 73 days.

(21) Appl. No.: 14/162,122

(22) Filed: Jan. 23, 2014

(65) Prior Publication Data
US 2014/0240559 A1 Aug. 28, 2014

(30) Foreign Application Priority Data
Feb. 26, 2013 (JP) ................................. 2013-035946

(51) Int. Cl.
*H04N 5/335* (2011.01)
*G02B 27/42* (2006.01)
(Continued)

(52) U.S. Cl.
CPC .............. *H04N 5/335* (2013.01); *G02B 3/0056* (2013.01); *G02B 13/001* (2013.01); *G02B 27/4205* (2013.01); *H04N 5/2254* (2013.01); *H04N 5/2257* (2013.01); *H04N 13/0271* (2013.01)

(58) Field of Classification Search
None
See application file for complete search history.

(56) References Cited

U.S. PATENT DOCUMENTS 5,485,204 A * 1/1996 Taniji ..................... H04N 9/045
  348/238
9,100,635 B2 * 8/2015 Duparre ............... H04N 17/002
(Continued)

FOREIGN PATENT DOCUMENTS

JP 2007-322844 A 12/2007
JP 2011-232772 A 11/2011

OTHER PUBLICATIONS

U.S. Appl. No. 14/165,925, filed Jan. 28, 2014, Kobayashi, et al.
(Continued)

*Primary Examiner* — Shahbaz Nazrul
(74) *Attorney, Agent, or Firm* — Oblon, McClelland, Maier & Neustadt, L.L.P.

(57) ABSTRACT

A solid state imaging device according to an embodiment includes: an imaging element formed on a semiconductor substrate, and including pixel blocks each having pixels; a main lens forming an image of a subject on an imaging plane; a microlens array including microlenses corresponding to the pixel blocks, the microlens array reducing an image to be formed on the imaging plane by Nf times or less and forming reduced images on the pixel blocks corresponding to the respective microlenses; and an image processing unit enlarging and synthesizing the reduced images formed by the microlenses, the solid state imaging device meeting conditions of an expression $MTF_{Main}(u) \leq MTF_{ML}(u) \leq MTF_{Main}(u \times Nf)$ where u denotes an image spatial frequency, $MTF_{ML}(u)$ denotes an MTF function of the microlenses, and $MTF_{Main}(u)$ denotes an MTF function of the main lens.

12 Claims, 20 Drawing Sheets

(51) Int. Cl.
  *G02B 13/00* (2006.01)
  *G02B 3/00* (2006.01)
  *H04N 13/02* (2006.01)
  *H04N 5/225* (2006.01)

(56) References Cited

U.S. PATENT DOCUMENTS

| 2004/0223229 | A1* | 11/2004 | Ishikawa | B41J 2/451 359/663 |
| 2006/0139476 | A1* | 6/2006 | Sasaki | G02B 27/46 348/342 |
| 2008/0118867 | A1* | 5/2008 | Sato | G03F 7/2057 430/286.1 |
| 2010/0165134 | A1* | 7/2010 | Dowski, Jr. | B24B 13/06 348/218.1 |
| 2012/0218448 | A1 | 8/2012 | Ueno et al. | |
| 2012/0229683 | A1* | 9/2012 | Kobayashi | H04N 5/232 348/246 |
| 2013/0240709 | A1* | 9/2013 | Ueno | H01L 27/146 250/208.1 |
| 2013/0242161 | A1* | 9/2013 | Kobayashi | H04N 5/2254 348/340 |
| 2014/0285693 | A1* | 9/2014 | Kobayashi | G02B 3/0062 348/294 |

OTHER PUBLICATIONS

K. Fife et al., "A 3D multi-aperture image sensor architecture", Custom Integrated Circuits Conference, Sep. 2006, pp. 281-284, 4 pages.

* cited by examiner (SPECIFIC EXAMPLE)

| PLANE NUMBER | | c | d | $n_d$ | $v_d$ | R |
|---|---|---|---|---|---|---|
| 1 | L1 | $6.54 \times 10^{-1}$ | 1.0 | 1.638 | 55.38 | 1.00 |
| 2 | | $-1.57 \times 10^{-1}$ | $2.5 \times 10^{-1}$ | | | 1.00 |
| 3 | L2 | $-5.03 \times 10^{-1}$ | 1.0 | 1.612 | 37.01 | $5.00 \times 10^{-1}$ |
| 4 | | $9.81 \times 10^{-1}$ | $2.5 \times 10^{-1}$ | | | $3.10 \times 10^{-1}$ |
| 5 | | 0.0 | $2.5 \times 10^{-1}$ | | | $3.81 \times 10^{-1}$ |
| 6 | L3 | $5.71 \times 10^{-1}$ | 1.0 | 1.743 | 44.79 | $6.10 \times 10^{-1}$ |
| 7 | | $-1.57 \times 10^{-1}$ | $9.1 \times 10^{-1}$ | | | $6.10 \times 10^{-1}$ |
| 8 | MLA | 0.0 | $1.5 \times 10^{-1}$ | 1.458 | 67.83 | $7.05 \times 10^{-1}$ |
| 9 | | $-2.38 \times 10^{-1}$ | $6.0 \times 10^{-2}$ | | | $7.05 \times 10^{-1}$ |
| 10 | IMAGE PLANE | | | | | $7.05 \times 10^{-1}$ |
| FOCAL LENGTH | 4 | | | | | |
| F# | 2.8 | | | | | |
| ENTIRE OPTICAL LENGTH | 4.87 | | | | | |

FIG. 13

(COMPARATIVE EXAMPLE)

| PLANE NUMBER | | c | d | $n_d$ | $v_d$ | R |
|---|---|---|---|---|---|---|
| 1 | L1 | $6.54 \times 10^{-1}$ | 1.00 | 1.638539 | 55.38 | $9.15 \times 10^{-1}$ |
| 2 | | $-1.57 \times 10^{-1}$ | $2.50 \times 10^{-1}$ | | | $6.61 \times 10^{-1}$ |
| 3 | L2 | $-5.03 \times 10^{-1}$ | 1.00 | 1.612929 | 37.0053 | $4.44 \times 10^{-1}$ |
| 4 | | $9.81 \times 10^{-1}$ | $2.50 \times 10^{-1}$ | | | $3.01 \times 10^{-1}$ |
| 5 | | 0.0 | $2.50 \times 10^{-1}$ | | | $3.81 \times 10^{-1}$ |
| 6 | L3 | $5.71 \times 10^{-1}$ | 1.0 | 1.743997 | 44.7864 | $6.02 \times 10^{-1}$ |
| 7 | | $-1.57 \times 10^{-1}$ | $1.17 \times 10^{-1}$ | | | $6.02 \times 10^{-1}$ |
| 8 | IMAGE PLANE | 0.0 | 0.0 | | | $8.00 \times 10^{-1}$ |
| FOCAL LENGTH | 4 | | | | | |
| F# | 2.8 | | | | | |
| ENTIRE OPTICAL LENGTH | 4.92 | | | | | |

FIG. 18

IMAGING DEVICE, PORTABLE INFORMATION TERMINAL, AND IMAGING SYSTEM

CROSS REFERENCE TO RELATED APPLICATIONS

This application is based upon and claims the benefit of priority from the prior Japanese Patent Application No. 2013-35946, filed on Feb. 26, 2013, the entire contents of which are incorporated herein by reference.

FIELD

Embodiments described herein relate generally to solid state imaging devices, portable information terminals, and solid state imaging systems.

BACKGROUND

Various techniques such as a technique using a reference light to measure the intensity or return time of a light reflected from a subject, or a stereo ranging technique using a plurality of cameras are known as imaging techniques for obtaining two-dimensional information on the depth-direction distance to a subject. Use of such image information for obtaining a distance (hereinafter also referred to as the "distance image information") enables subject recognition that is more sophisticated than subject recognition based on image information obtained from regular cameras. Devices that can obtain distance image information are therefore increasingly needed as relatively inexpensive products used as consumer appliances, games, and industrial devices.

With imaging techniques for obtaining distance image information, a compound-eye imaging device having an imaging lens and capable of obtaining a large number of parallax images and measuring a distance based on triangulation with a single camera is proposed. Such an imaging device includes, for example, a main imaging lens, and a plurality of optical systems serving as re-imaging optical systems between the main imaging lens and an imaging element. An example of the aforementioned optical systems is a micro lens array having microlenses on a plane surface. Pixels are arranged under the microlenses at locations corresponding to the respective microlenses in order to obtain images formed thereby. An image formed by the main imaging lens is re-imaged on the imaging element by the re-imaging microlenses with viewpoints being shifted due to parallaxes existing at the locations of the respective microlenses (parallax image group). The distance to the subject can be estimated based on the principles of triangulation by performing image processing on the parallax image group obtained from the microlenses. Furthermore, a two-dimensional image can be reconstructed from the images by performing image processing to combine the images.

BRIEF DESCRIPTION OF THE DRAWINGS

FIG. 13 is a drawing showing examples of numerical values of the optical system of the specific example.

FIG. 18 is a drawing showing examples of numerical values of the optical system of the comparative example.

DETAILED DESCRIPTION

Figure 1:
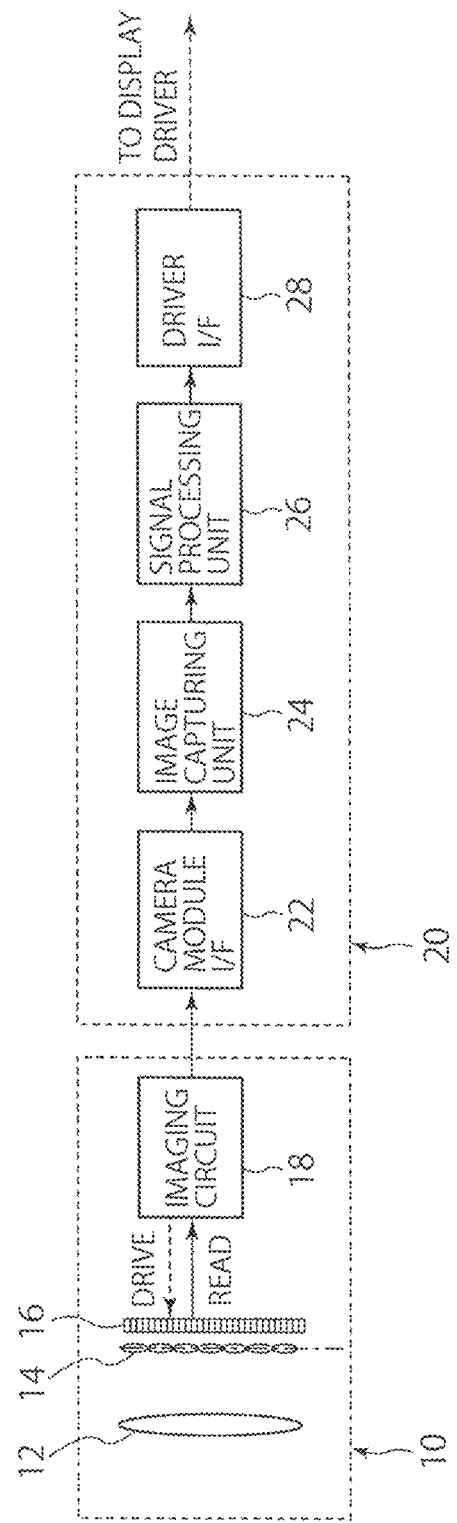
FIG. 1 is a block diagram showing a solid state imaging device according to a first embodiment.

Recently, there are demands for obtaining both high-accuracy distance images and good visible images with a small, thin (low profile), low-power-consumption, and single-module imaging device.

Furthermore, portable terminals such as portable information terminals and mobile phones are rapidly becoming ubiquitous. Imaging modules implemented in such portable terminals need to be small, low-profile (thin), and low-power-consumption as well as capable of acquiring high-resolution two-dimensional visible images.

In addition to obtaining visible images, new usages of imaging modules with high value-adding functions such as gesture-inputting and distance-image capturing will be sought in the future.

The pixel pitch of imaging elements in imaging modules is getting closer to the order of visible light wavelength, and becoming finer. The diffraction limit, which is the limit of a light-collecting spot diameter size, is proportional to the wavelength or F-number of an optical system. Therefore, in order to achieve a high resolution for a pixel pitch, the F-number of the optical system should also be reduced at the same time. However, when an optical system is designed to have a low F-number, the aperture aberration is increased, which makes lens design and manufacturing difficult, and which increases the number of lens elements. For example, recently optical systems with the F-number of about 2 having four or five lens elements have been proposed. However, with such lens configurations, the aberration cannot be sufficiently compensated, which raises problems such as an increase in the number of components, higher assembling costs, and difficulties in downsizing the system, caused by the increase in the number of lenses.

As described above, optical systems being required to have a low F-number, high resolution, and a wide angle of view, at present, many lenses are necessary to compensate for aberrations. As a result, the number of lens components is increased, and the design is complicated. Although there is a strong demand that the lens systems, which occupy a large amount of volume in imaging modules, be downsized and thinned, the downsizing and the thinning are difficult at the present stage since the design margin and the manufacture margin are tight. As described above, it has become more and more difficult to design and manufacture downsized high-resolution imaging modules.

A solid state imaging device according to an embodiment includes: an imaging element formed on a semiconductor substrate, and including pixel blocks each having pixels; a main lens forming an image of a subject on an imaging plane; a microlens array including microlenses corresponding to the pixel blocks, the microlens array reducing an image to be formed on the imaging plane by Nf times or less and forming reduced images on the pixel blocks corresponding to the respective microlenses; and an image processing unit enlarging and synthesizing the reduced images formed by the microlenses, the solid state imaging device meeting conditions of an expression $MTF_{Main}(u) \leq MTF_{ML}(u) \leq MTF_{Main}(u \times Nf)$ where u denotes an image spatial frequency, $MTF_{ML}(u)$ denotes an MTF function of the microlenses, and $MTF_{Main}(u)$ denotes an MTF function of the main lens.

Embodiments will now be explained with reference to the accompanying drawings.

First Embodiment

FIG. 1 shows a solid state imaging device (hereinafter also referred to as the "camera module") according to the first embodiment. The solid state imaging device 1 according to the first embodiment includes an imaging module unit 10 and an imaging signal processor (hereinafter also referred to as the "ISP") 20.

The imaging module unit 10 includes an imaging optics (hereinafter also referred to as the "main lens") 12, a microlens array 14 (hereinafter also referred to as the "MLA"), an imaging element 16, and an imaging circuit 18. The imaging optics 12 functions as an imaging optical system to capture light from a subject into the imaging element 16. The imaging element 16 functions as an element for converting the light captured by the imaging optics 12 to signal charges, and includes a plurality of pixels (for example, photodiodes serving as photoelectric conversion elements) arranged in a two-dimensional array form. The microlens array 14 is, for example, a microlens array including a plurality of microlenses, or a micro-optical system such as a prism. The microlens array 14 functions as an optical system for reducing and re-forming images on pixel blocks corresponding to respective microlenses (hereinafter also referred to as the "MLs") from light rays that are focused on an image plane by the imaging optics 12. The imaging circuit 18 includes a drive circuit unit (not shown) that drives the respective pixels of the pixel array of the imaging element 16, and a pixel signal processing circuit unit (not shown) that processes signals outputted from the pixel region. The drive circuit unit and the pixel signal processing circuit unit may be combined with each other to form a drive and processing circuit. In the embodiments described below, the imaging circuit 18 includes a drive and processing circuit. The drive circuit unit includes, for example, a vertical selection circuit that sequentially selects pixels to be driven in a vertical direction in units of horizontal line (row), a horizontal selection circuit that sequentially selects pixels to be driven in units of column, and a timing generator (TG) circuit that drives the selection circuits with several types of pulses. The pixel signal processing circuit unit includes such circuits as an analog-to-digital conversion circuit that converts analog electric signals from the pixel region to digital signals, a gain adjustment and amplifier circuit that performs gain adjustment and amplifying operations, and a digital signal processing circuit that corrects the digital signals.

The ISP 20 includes a camera module interface (I/F) 22, an image capturing unit 24, a signal processing unit 26, and a driver I/F 28. A RAW image obtained by the imaging operation performed by the imaging module unit 10 is captured through the camera module I/F 22 into the image capturing unit 24. The signal processing unit 26 also performs a signal processing operation on the RAW image captured into the image capturing unit 24. The driver I/F 28 outputs, to a display driver that is not shown, an image signal having been subjected to the signal processing operation at the signal processing unit 26. The display driver displays the image formed by the solid state imaging device.

Figure 2:
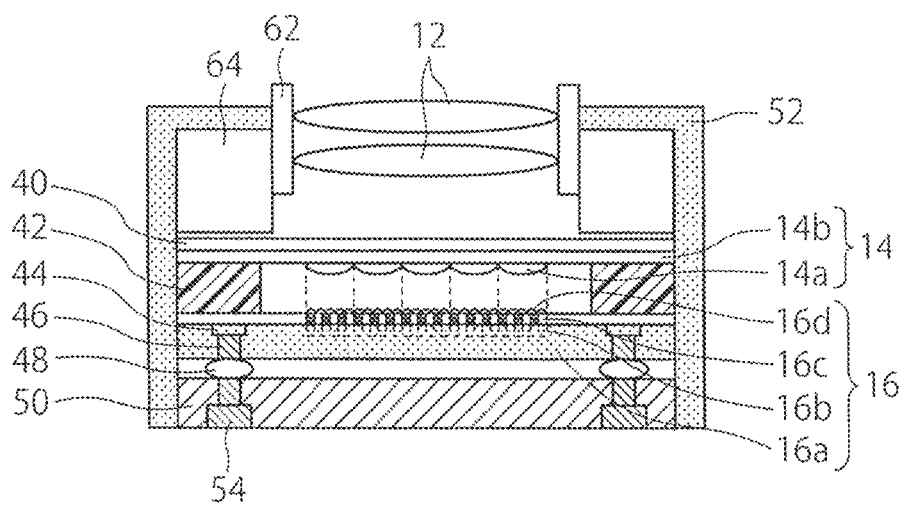
FIG. 2 is a cross-sectional view showing the solid state imaging device 1 according to the first embodiment.

FIG. 2 shows a cross-section of the solid state imaging device 1 according to the first embodiment. As shown in FIG. 2, the imaging element 16 of the solid state imaging device 1 according to the first embodiment includes a semiconductor substrate 16a, pixels 16b, color filters 16c, and microlenses 16d for collecting light for the pixels. The pixels 16b are formed on the semiconductor substrate 16a, and have photodiodes. Also on the semiconductor substrate 16a is formed a drive/readout circuit (not shown) that drives the pixels 16b to read the signals from the pixels 16b.

The color filters 16c including R filters (having a high transmittance for light in the red wavelength range), G filters (having a high transmittance for light in the green wavelength range), and B filters (having a high transmittance for light in the blue wavelength range) are formed above the pixels 16b, each color filter corresponding to one pixel 16b. The color filters 16c may include W filters (that passes lights in the red, green and blue wavelength ranges). Above the color filters 16c, the microlenses 16d for use in collecting light for pixel are formed so as to correspond to the respective pixels. The microlenses 16d are not necessarily formed.

A microlens array 14 is arranged above the color filters 16c. The microlens array 14 includes a microlens unit 14a formed on a visible light transmitting substrate 14b. The microlens unit 14a is arranged on the imaging element 16 side viewed from the visible light transmitting substrate 14b, and includes a plurality of microlenses arranged in a two-dimensional array form. The arrangement in the array is a square arrangement that has four-fold (90 degrees) symmetry with respect to the center of the array, or hexagonal arrangement that has six-fold (60 degrees) symmetry with respect to the center of the array. Each microlens corresponds to a pixel block including a plurality of pixels formed on the semiconductor substrate 16a, and functions as an optical system for forming a reduced image on the corresponding pixel block.

The visible light transmitting substrate 14b is aligned in the optical axis direction (the vertical direction in FIG. 2) and bonded with the semiconductor substrate 16a by a spacer 42 of a resin material formed around the imaging region, on which the pixels 16b are formed. In bonding the semiconductor substrate 16a with the visible light transmitting substrate 14b, the alignment is performed using the alignment markings etc. The visible light transmitting substrate 14b can be formed of a material having a function of, for example, cutting off unnecessary near infrared light in addition to the function of transmitting visible light, or can include a multilayer film or single-layer film that transmit visible light but reflects near infrared light.

If necessary, an optical filter 40 may be formed above the microlens array 14. For example, if the visible light transmitting substrate 14b does not have the function of cutting off near infrared light, an optical filter 40 having a function of cutting off near infrared light is provided.

Electrode pad 44 for reading the pixels 16b are formed in the semiconductor substrate 16a, and penetrating electrodes 46 are formed under the electrode pads 44, the penetrating electrodes 46 penetrating the semiconductor substrate 16a and connecting to a processing and driving chip 50 under the imaging element 16. The semiconductor substrate 16a is electrically connected to the processing and driving chip 50 via the penetrating electrodes 46 and bumps 48 formed between the penetrating electrodes 46 and the processing and driving chip 50. The processing and driving chip 50 includes a drive and processing circuit (the imaging circuit 18 shown in FIG. 1) that drives the imaging element 16 and processes the read signals. The semiconductor substrate 16a and the processing and driving chip 50 may be electrically connected with each other not only by the penetrating electrodes 46 but also by metal wires etc. connecting the electrode pads formed on the both sides.

Above the visible light transmitting substrate 14b, for example an imaging lens 12 that includes a plurality of lens elements and serves as an imaging optics is arranged. The imaging lens 12 is attached to a lens barrel 62 that is attached to a lens holder 64. The position for mounting the imaging lens 12 may be adjusted based on the relationship between the pressing force and the output image when the lens barrel 62 is attached to the lens holder 64. A light shielding cover 52 is attached to the surrounding portions (side surfaces) of the processing and driving chip 50, the semiconductor substrate 16a, the visible light transmitting substrate 14b, and the lens holder 64. Module electrodes 54 that electrically connect the processing and driving chip 50 to the outside are arranged below the processing and driving chip 50.

(Relationship Between Distance to Subject and Light Rays)

Figure 3:
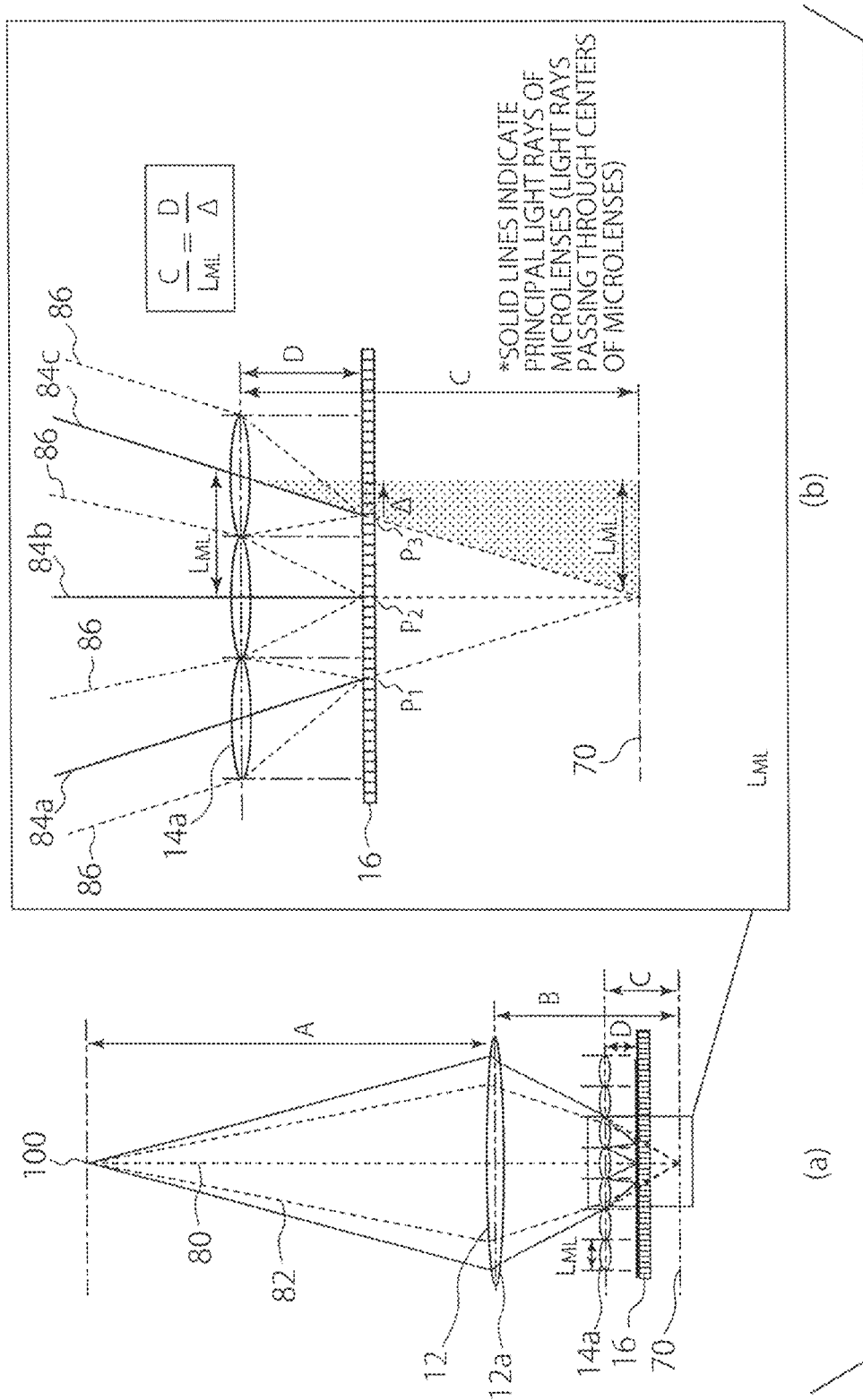
FIGS. 3(a) and 3(b) are drawings showing the relationship between the distance to a subject and light rays in an optical system of the solid state imaging device according to the first embodiment.

The relationship (relationship in geometric optics) between the distance to the subject and the rays of light in the optical system (virtual image optical system) of the solid state imaging device 1 according to the first embodiment will be described below with reference FIGS. 3(a) and 3(b). For simplification, it is assumed herein that the expressions relating to the imaging hold in the paraxial region, and the drawings only illustrate the area near the optical axis. FIG. 3(a) illustrates the solid state imaging device 1 in its entirety. FIG. 3(b) is an extended view of the microlens region shown in FIG. 3(a).

If there is only the imaging optics (imaging lens) 12, a principal ray 80 from a subject 100 on the optical axis and peripheral rays 82, which are homologous rays of the principal ray 80, form an image on a virtual imaging plane 70 determined by the effective focal length f of the imaging optics 12 and the distance A between the imaging optics 12 and the subject 100 so as to meet the relationship defined by the expression (1):

$$\frac{1}{f} = \frac{1}{A} + \frac{1}{B} \quad (1)$$

where f denotes the effective focal length of the imaging lens 12, A denotes the distance from the object side principal plane of the imaging lens 12 to the subject point 100, and B denotes the distance from the image side principal plane of the imaging lens 12 to the virtual imaging plane 70. The image magnification (lateral magnification) M of the imaging lens 12 can be expressed by the following expression:

$$M = \frac{B}{A} \quad (2)$$

In this embodiment, the virtual imaging plane 70 of the imaging lens 12 is placed after the imaging element 16 (on the side opposite to the subject 100). Since the microlenses 14a are arranged before the virtual imaging plane 70, the light rays are focused on the plane of the imaging element 16. This means that the light rays 80, 82 are caused to form reduced images based on a virtual image relationship. The imaging system of the microlenses 14a can be expressed by the following expression:

$$\frac{1}{g} = -\frac{1}{C} + \frac{1}{D} \quad (3)$$

where g denotes the focal length of each microlens 14a, C denotes the distance from the object side principal plane of each microlens 14a to the virtual imaging plane, and D denotes the distance from the image side principal plane of each microlens 14a to the imaging point thereof. At this time, the image magnification of the imaging system of the microlenses 14a can be expressed by the following expression (4).

$$N = \frac{D}{C} \quad (4)$$

Here, a variable E defined by the expression (5) is introduced based on the geometric relationship. If the optical system is a fixed focus optical system, the variable E is a fixed design value.

$$E = B - C \quad (5)$$

The pitch or the distance between the centers of two adjacent microlenses 14a is denoted by $L_{ML}$. When rays of light 84a, 84b, 84c, and 86 from the same subject 100 are divided, by the microlenses 14a that are adjacent to each other, to image points $p_1$, $p_2$, $p_3$ to form images, the relationship between $L_{LM}$ and the image shift amount on one side $\Delta$ can be expressed by the expression (6) based on the geometric relationship among the principal light rays 84a, 84b, 84c for the respective microlenses 14a shown in FIG. 3(b).

$$\frac{C}{L_{ML}} = \frac{D}{\Delta} \quad (6)$$

From the expressions (1), (2), and (6), the relationship between the distance A between the subject 100 and the imaging optics 12 and the image shift amount $\Delta$ can be expressed by the following expression (7).

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{DL_{ML}}{\Delta}}\right)^{-1} \quad (7)$$

In the expression (7), f, E, and $L_{ML}$ are the parameters that are determined in design, and therefore are known fixed values. The variation in D is very slight relative to the variation in A. Accordingly, D can be regarded as a fixed value $D_0$. $D_0$ denotes the distance from the image side principal plane of each microlens 14a to the plane of the imaging element 16. Therefore, $\Delta$ is uniquely determined by A. At this time, the expression (7) can be transformed into the following expression (8).

$$A = \left(\frac{1}{f} - \frac{1}{B}\right)^{-1} = \left(\frac{1}{f} - \frac{1}{E+C}\right)^{-1} = \left(\frac{1}{f} - \frac{1}{E + \frac{D_0 L_{ML}}{\Delta}}\right)^{-1} \quad (8)$$

Since the values f, E, $D_0$, $L_{ML}$ are design values and known, the subject distance A can be calculated if the image shift amount $\Delta$ can be detected from the imaging element 16.

In order to obtain the image shift amount $\Delta$ between images when the light rays from the same subject 100 form images at the image points $p_1$, $p_2$, $p_3$ by means of the imaging lens 12, and the microlenses 14a, an image matching process is performed on the images formed by the adjacent imaging microlenses 14a recorded by the element 16. The image matching process can be performed by using a known template matching method for checking, for example, the degree of similarity or dissimilarity between two images. Furthermore, the shift position can be obtained more accurately by interpolating the degree of similarity or dissimilarity with a continuing fitting function etc. pixel by pixel to obtain the sub-pixel position for providing a maximum or minimum of the fitting function. In this manner, the shift amount can be obtained more accurately.

(Method of Reconstituting Two-Dimensional Image)

Figure 4:
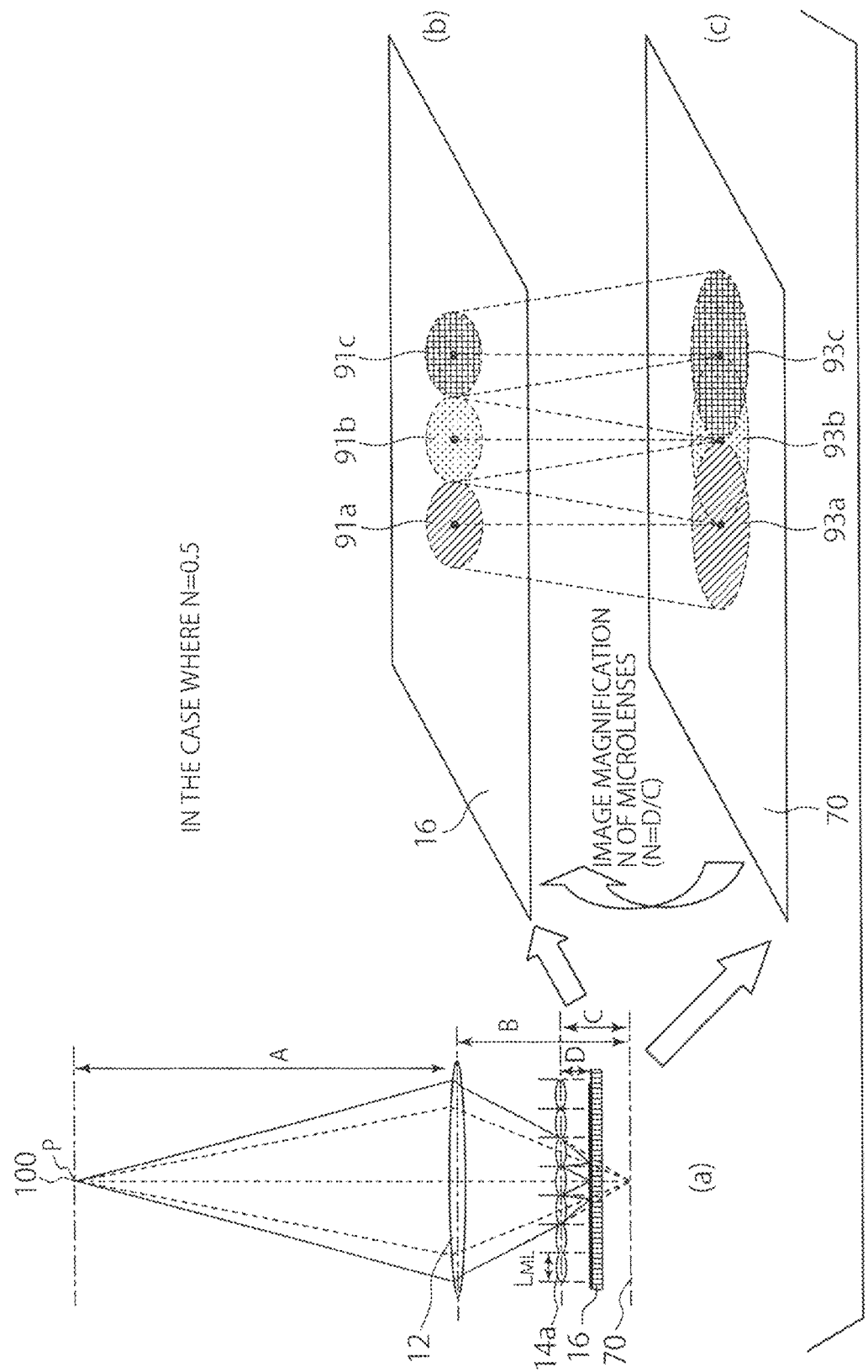
FIGS. 4(a) to 4(c) are drawings showing a method of reconstructing a two-dimensional image with no overlap from microlens images by which the same subject is photographed several times.

A method of reconstructing a two-dimensional image without any overlap from a group of microlens images for the same subject taken at several points ($p_1$, $p_2$, $p_3$, . . . ) will be described with reference to FIGS. 4(a) to 4(c). Like FIG. 3(a), FIG. 4(a) shows the relationship between the rays of light and the distance from the optical system (virtual optical system) of the solid state imaging device 1 according to the first embodiment to the subject. FIGS. 4(b) and 4(c) explain the relationships of the overlapped visual fields among adjacent microlenses.

Consider the case where three adjacent microlenses form microlens images 91a, 91b, 91c, respectively, on the imaging element 16, as shown in FIGS. 4(b) and 4(c). In order to form such microlens images without any overlap, the effective f-number of the imaging lens 12 should match the effective f-number of the microlenses 14a.

The visual fields of the microlens images 91a, 91b, 91c correspond to the visual fields 93a, 93b, 93c on the virtual imaging plane 70, which overlap each other as shown in FIG. 4(c). In the case shown in FIGS. 4(b) and 4(c), the microlens images are arranged to be adjacent to each other without any space with the image magnification N being 0.5. After each visual field is enlarged by 0.5, each subject point is imaged with two or more overlaps. If N=0.5, the image on the virtual imaging plane 70 can be reproduced by enlarging each microlens image by 1/N, i.e., by 2.

The image magnification N can be obtained from the group of microlens images, using the relationship between the expressions (4) and (6) to derive the expression (9).

$$N = \frac{D}{C} = \frac{\Delta}{L_{ML}} \quad (9)$$

Since the pitch $L_{ML}$ of the microlenses 14a is known, if the shift amount $\Delta$ of the same subject 100 is obtained from the images, the image magnification N can be determined.

(Synthesis Method for Reconstructing Two-Dimensional Image)

Figure 5:
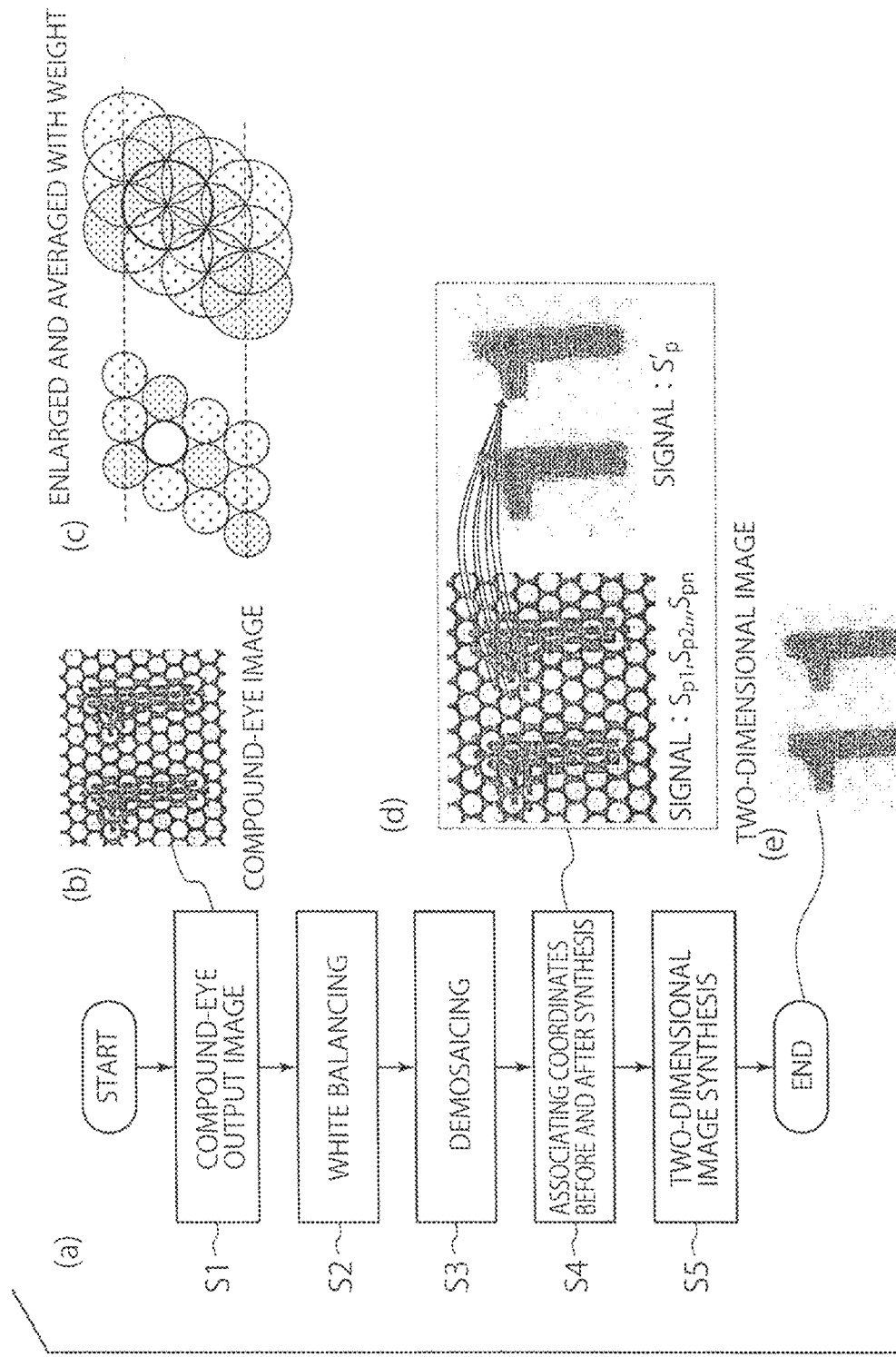
FIGS. 5(a) to 5(e) are drawings for explaining an image synthesis method for reconstituting a two-dimensional image.

Next, an image synthesis method for reconstructing a two-dimensional image will be described, referring to FIGS. 5(a) to 5(e). First, in step S1, a compound eye RAW image is derived from the imaging element 16. The compound eye RAW image is in a state as outputted from the imaging element 16. FIG. 5(b) shows an example thereof. White balancing for adjusting the signal balance among the B, G, and R pixels is performed on the compound eye RAW image using a known technique (step S2). Subsequently, demosaicing is performed in which, since there is no signal information of G and B pixels at the positions of R pixels for example, the G and B signals are estimated and produced by referring to the pixels arranged in the surrounding portions (step S3). As an example of easy solution, a process for obtaining an average value from the surrounding pixels is performed. Various other methods, including the one broadening the range of pixels to be referred to, can be used depending on the necessity (see FIG. 5(c)). The demosaicing is also performed on the G pixels and B pixels.

The image points $p_1$, $p_2$, . . . , $p_n$ corresponding to the point P of the subject 100 shown in FIGS. 3(a) and 3(b) are recorded as pixel signal values $S_{p1}$, $S_{p2}$, . . . , $S_{pn}$ in the imaging element 16. Subsequent to the demosaicing, the pixel signal values $S_{p1}$, $S_{p2}$, . . . , $S_{pn}$ are associated with a synthesized signal $S'_p$ in the n-to-one relationship (step S4 and FIG. 5(d)). As described above, the association is performed by detecting, from the image, the relationship of the shift amount $\Delta$ among the image points and the relationship of the overlaps among the visual fields. Since $\Delta$ can be obtained by assuming the subject distance A, $\Delta$ obtained from the assumed subject distance A can be used alternatively. Thereafter, an image is synthesized by a two-dimensional image synthesis method at step S5 to obtain a two-dimensional image, and the flow ends. FIG. 5(e) shows an example of the two-dimensional image obtained in such a manner.

Next, the two-dimensional image synthesis method will be described. The pixel signal values of n pixels are denoted by $S_{p1}$, $S_{p2}$, . . . , and $S_{pn}$, and the noise values of the pixels are denoted by $N_{p1}$, $N_{p2}$, . . . , and $N_{pn}$. First, luminance correction processing is performed on the respective pixel signal values and noise values. The luminance correction processing is performed when the luminance distribution of the periphery portion is more degraded than that of the other portions in each microlens image. The pixel signal values $S_{p1}, S_{p2}, \ldots, S_{pn}$ are multiplied by luminance correction coefficients $a_1, a_2, \ldots, a_n$, respectively. Subsequently, the multiplied values $a_i S_{pi}$ (i=1, ..., n) are averaged using the expression (10) to obtain a synthesized signal value $S'_p$ that corresponds to the value of weighted average. The noise value $N'_p$ included in the synthesized signal value $S'_p$ is calculated using the expression (11).

$$S'_p = \{a_1 S_{p1} + a_2 S_{p2} + \ldots + a_n S_{pn}\}/n \quad (10)$$

$$N'_p = \{(a_1 N_{p1})^2 + (a_2 N_{p2})^2 + \ldots + (a_n N_{pn})^2\}^{1/2}/n \quad (11)$$

The order of the aforementioned steps may be changed depending on which synthesis method is selected. For example, the order of the steps S1 to S5 may be arbitrarily changed by, for example, performing the demosaicing after the two-dimensional image synthesis processing.

(Limiting Factor of MTF of Two-Dimensional Visible Image 1: Diffraction Limit in Lens Optical System)

Modulation transfer function (MTF) is a value indicating the degree of modulation and the capability of transferring image frequency of an optical system. Hereinafter, two factors that limit the MTF value of a two-dimensional visible image that can be obtained by an imaging device will be described.

First, the smallest light-collecting spot size determined by the diffraction phenomenon of an optical system is limited. A diffraction limited spot size is broadened in terms of waves even with an ideal aplanatic lens, and the spot size has a limit at a finite size. The bottom of the zero-order diffraction intensity of an aplanatic lens with a circular aperture is in a circular shape, and called "Airy disc." The radius $r_a$ of the Airy disc can be theoretically obtained, and expressed by the following expression:

$$ra = 1.22 \lambda F$$

where $\lambda$ denotes the wavelength of light, and F denotes the F-number.

As a result of the diffraction limit, the value of MTF representing the capability of transferring image frequency decreases as the image frequency u increases. The following expression (12) is known as a theoretical expression of MTF of aplanatic lenses.

$$MTF(u) = \frac{1}{\pi}\{(2\arccos(\lambda F u) = \sin(2\arccos(\lambda F u))\} \quad (12)$$

As can be understood from the expression (12), the value of MTF decreases as the image frequency u increases, and reaches 0 at an image frequency determined by the diffraction-limited spot-size. This image frequency is called "cutoff frequency" $u_c$, and can be expressed by the following expression (13).

$$u_c = \frac{1}{\lambda F} \quad (13)$$

Figure 6:
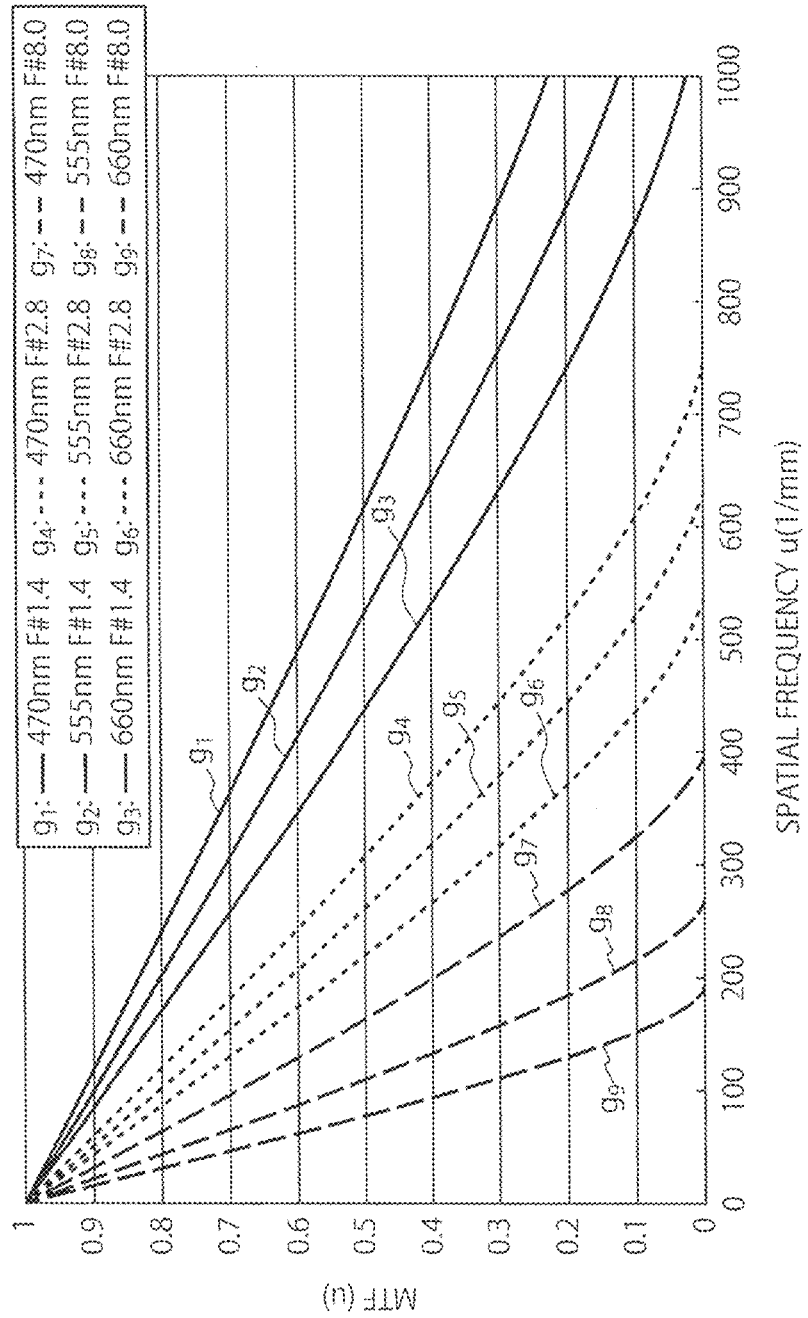
FIG. 6 is a drawing showing a frequency characteristic of MTF values.

It can be understood from the expression (13) that as the F-number (hereinafter also expressed as "F#") increases, or the wavelength becomes longer, the diffraction spot radius $r_a$ increases, and as a result the MTF characteristic degrades. For example, FIG. 6 shows, in the graphs $g_1$-$g_9$, the frequency characteristics of the MTF values obtained by the expression (13) in the cases where the wavelength $\lambda$ is 470 nm, 555 nm, and 660 nm, and F# is 1.4, 2.8, and 8.0 for each wavelength. The graph $g_1$ shows the case where the wavelength $\lambda$ is 470 nm and F# is 1.4, the graph $g_2$ shows the case where the wavelength $\lambda$ is 555 nm and F# is 1.4, the graph $g_3$ shows the case where the wavelength $\lambda$ is 660 nm and F# is 1.4. The graph $g_4$ shows the case where the wavelength $\lambda$ is 470 nm and F# is 2.8, the graph $g_5$ shows the case where the wavelength $\lambda$ is 555 nm and F# is 2.8, the graph $g_6$ shows the case where the wavelength $\lambda$ is 660 nm and F# is 2.8. The graph $g_7$ shows the case where the wavelength $\lambda$ is 470 nm and F# is 8.0, the graph $g_8$ shows the case where the wavelength $\lambda$ is 555 nm and F# is 8.0, and the graph $g_9$ shows the case where the wavelength $\lambda$ is 660 nm and F# is 8.0. Since the MTF value decreases as the wavelength becomes longer, or F# becomes greater, in order to obtain the resolution covering the red region with the wavelength of 600 nm or more, an optical design with a low F# is needed, as can be understood from FIG. 6.

(Limiting Factor of MTF of Two-Dimensional Visible Image 2: Sampling Limit of Imaging Element)

Figure 7:
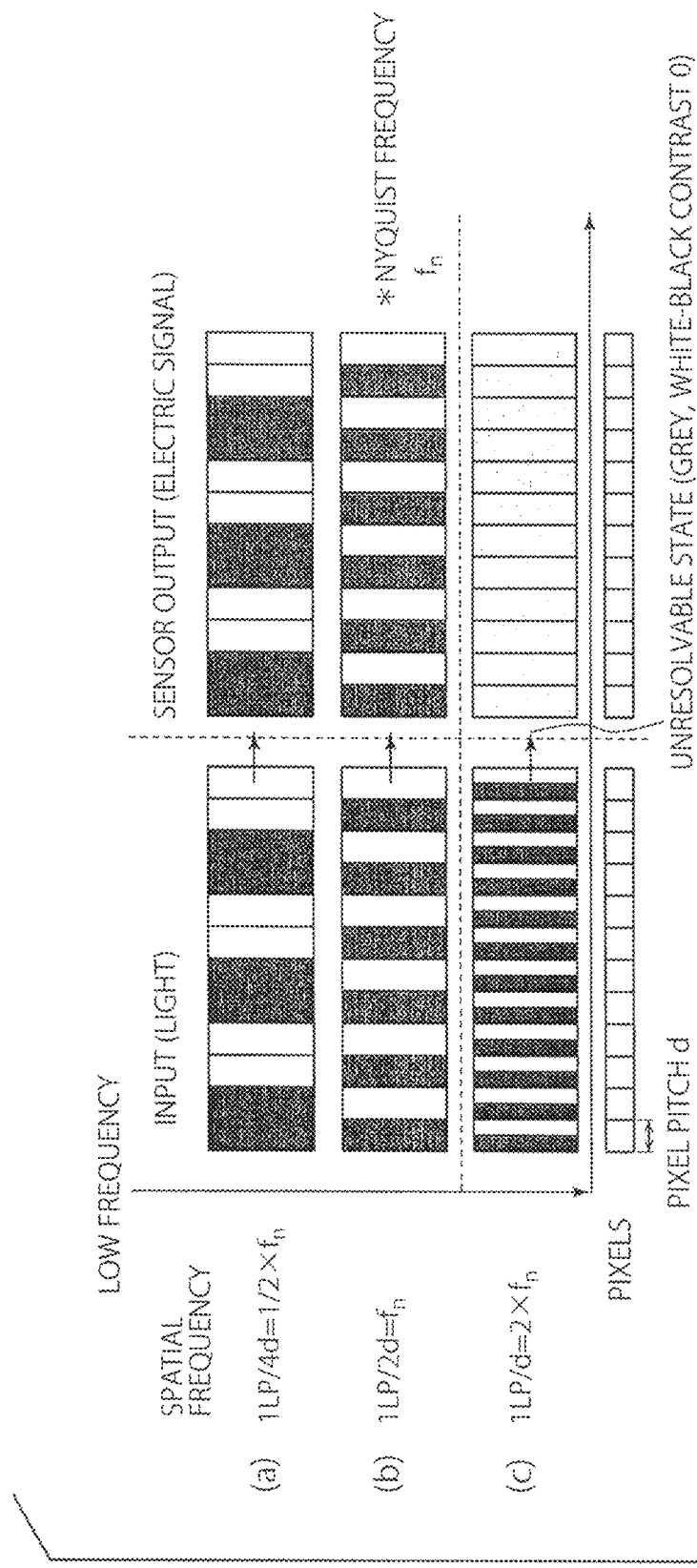
FIGS. 7(a) to 7(c) are drawings for explaining sensor sampling limit.

The second factor for limiting the MTF value obtainable by an imaging device is the pixel pitch of the imaging element. When the pixel pitch of the imaging element is represented by d, the maximum sampling frequency of an optical image projected onto the imaging element is called "Nyquist frequency" $f_n$, and can be expressed by $f_n = 1/2d$ (LP/mm), where LP is an abbreviation of Line Pair, meaning a pair including a white and a black lines. FIGS. 7(a) to 7(c) explain the sensor sampling limit. FIG. 7(a) shows the input (light) and the sensor output (electrical signal) when the spatial frequency is $f_n/2$, FIG. 7(b) shows the input and the sensor output when the spatial frequency is $f_n$, and FIG. 7(c) shows the input and the sensor output when the spatial frequency is $2f_n$. For example, in an imaging element including pixels with d=1.4 μm, the Nyquist frequency $f_n$ is 357 LP/mm. When d=1.1 μm, $f_n$ is 455 LP/mm. Thus, as the pixel pitch decreases, the maximum sampling frequency increases.

(Relationship in Optical Image Frequency Between Main Lens and Microlens)

Figure 8:
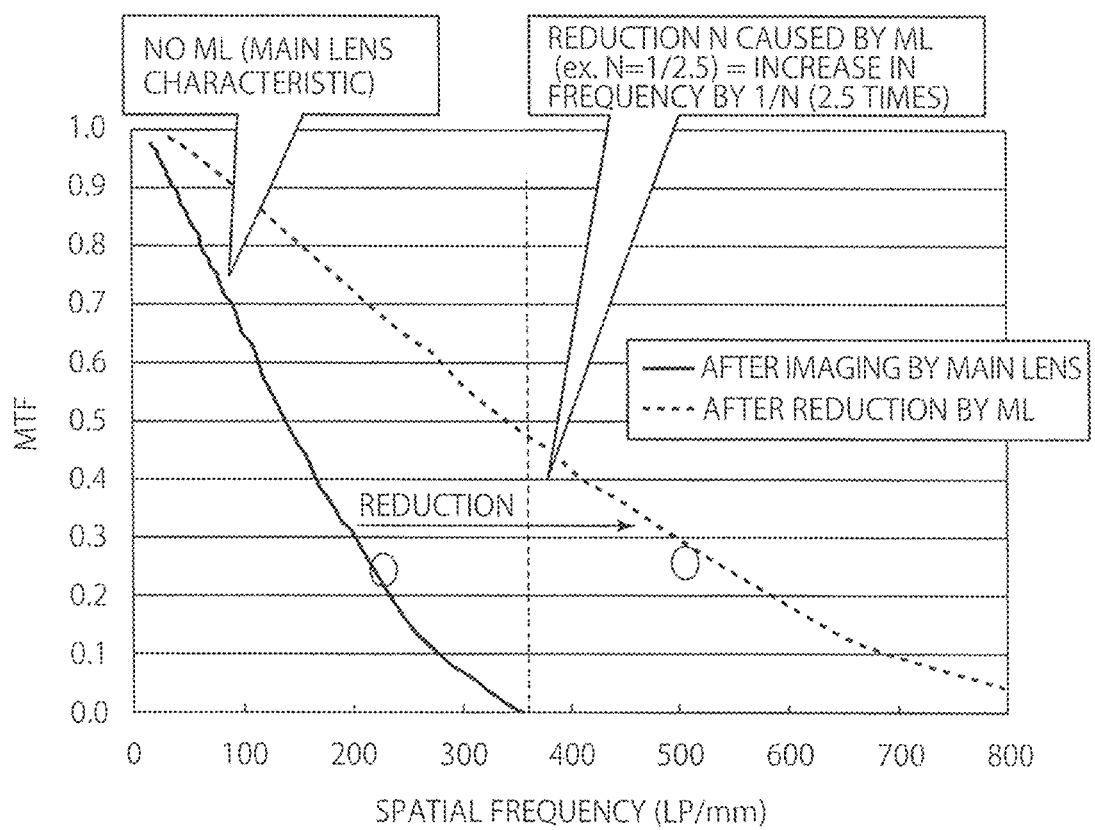
FIG. 8 is a drawing showing the change in image frequency caused by the reduction by means of microlenses.

FIG. 8 shows the MTF characteristic of the main lens of the solid state imaging device according to the first embodiment and the change in image frequency (spatial frequency) when the image formed by the main lens is reduced by a microlens (hereinafter referred to as "ML"). Consider the case where the pixel pitch d of the imaging element is 1.4 μm, and the main lens does not have a resolution when the Nyquist frequency is $f_n$=357 LP/mm or more. Reducing an image means miniaturizing the image, i.e., increasing the frequency. When an image formed by the main lens with the magnification of M (M<1) is further reduced by the microlens with the magnification of N (N<1), the image frequency of the image projected onto the imaging element is increased by 1/N (1/N>1) as compared with the case where there is no microlens and only the main lens is present. FIG. 8 shows the relationship when the reduction rate N by the microlens is 1/2.5. At this time, the frequency after the reduction by the microlens increases by 1/N times (2.5 times).

Figure 9:
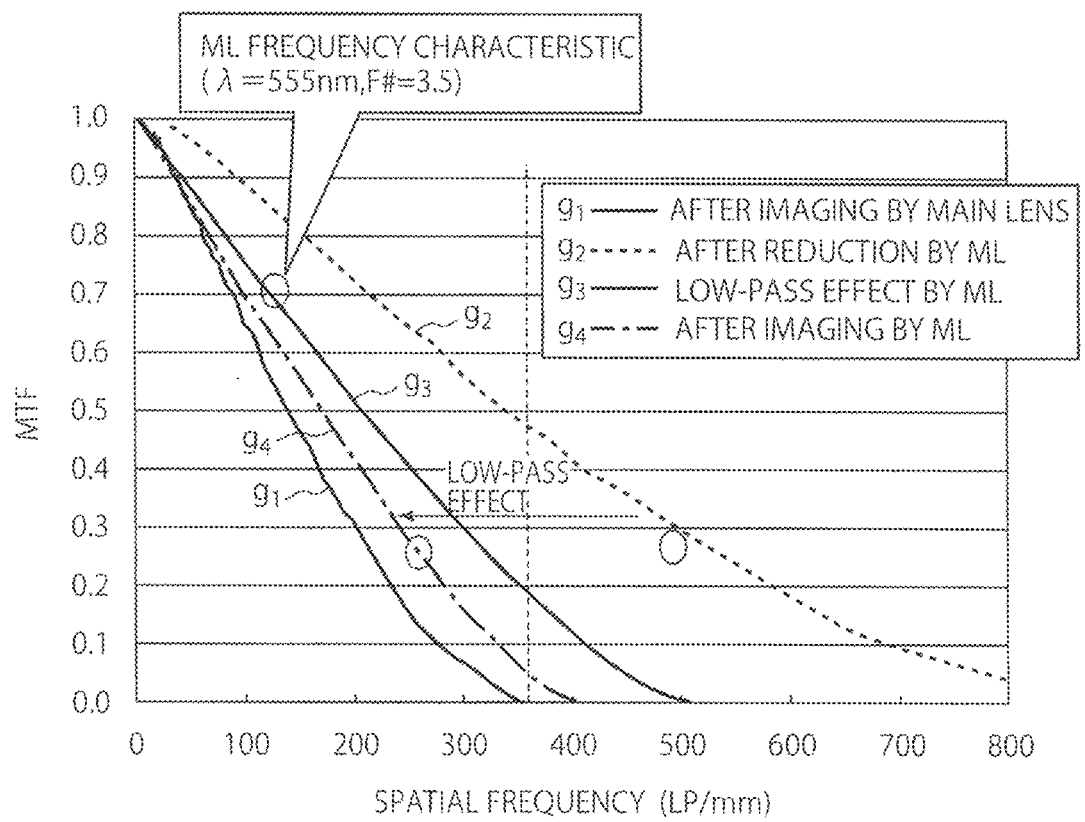
FIG. 9 is a drawing showing the image frequency of a sensor (image plane).

FIG. 9 shows the image frequency on the sensor plane (image plane), which is the sampling plane. In the relationship shown in FIG. 8, if the resolution performance of the microlens is sufficient, the image formed by the main lens is reduced by the microlens (see FIG. 8), and the image frequency increases by N times on the image plane (sensor plane). However, in an actual optical system, the frequency reproducibility (MTF) of the microlens is limited by the optical diffraction limit and the aberrations as described above. Accordingly, a low-pass effect, with which only images having a frequency lower than a certain frequency can be reproduced, occurs in the microlens as shown in FIG. 9, and the increase in frequency is limited. Incidentally, the graphs $g_2$ and $g_4$ shown in FIG. 9 are calculated with the wavelength λ being 555 nm, and the F# of the microlens being 3.5.

Figure 10:
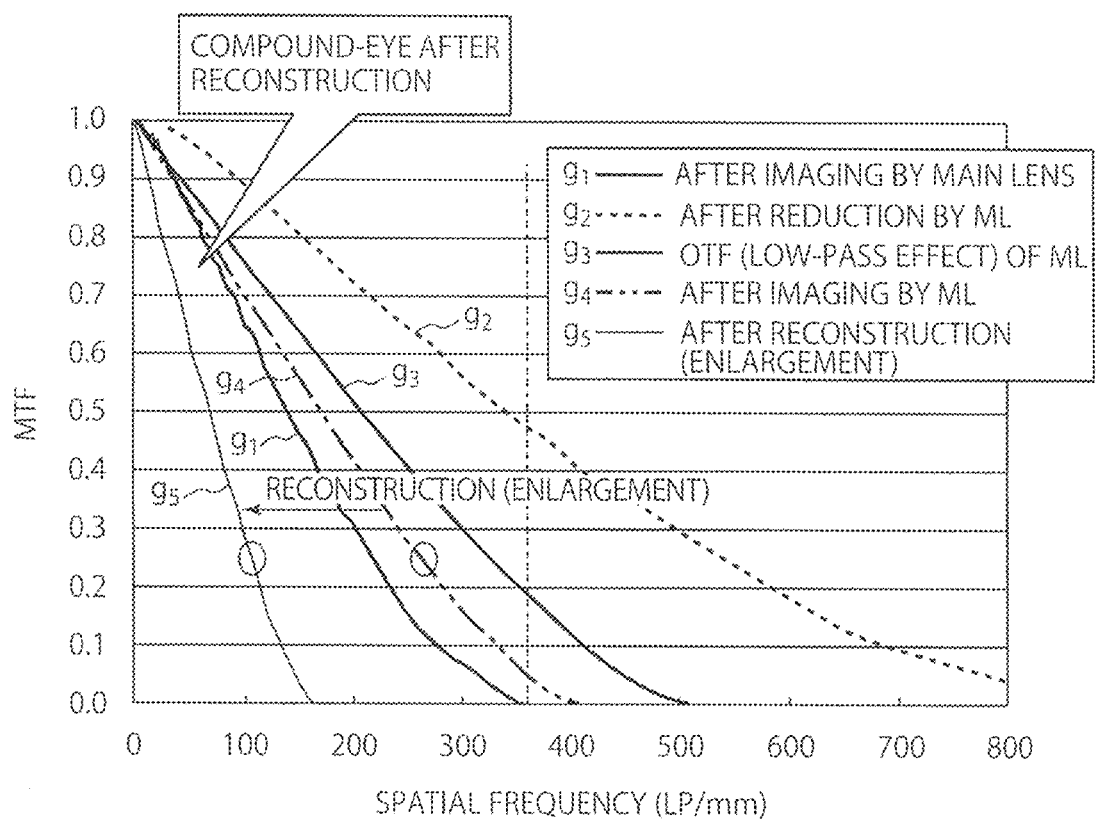
FIG. 10 is a drawing showing the image frequency characteristic of a reconstructed image.

FIG. 10 shows the image frequency characteristic of a reconstructed image. In the reconstruction, a process is performed to enlarge and add the microlens images to recover the reduction performed by the microlenses, as described above. Accordingly, after the enlargement, the frequency of the reconstructed image is reduced.

(Frequency Characteristic to be Held by Main Lens and Microlenses)

As described above, when an image is reduced, $MTF_{Main}(u)$ of the main lens is limited by $MTF_{ML}(u)$ of the microlens. Considering this principle, an ideal design could be made by setting $MTF_{Main}(u)$ of the main lens to be lower than $MTF_{ML}(u)$ of the microlens, and setting $MTF_{Main}(u)$ of the main lens after the reduction to be higher than $MTF_{ML}(u)$ of the microlens. Designing $MTF_{ML}(u)$ of the main lens to be lower means not requiring the respective aberration amounts as strictly as in the conventional cases. Alleviating the aberration requirement leads to increasing the degree of freedom in lens design. Therefore, designs with a smaller number of lenses and a lower F# are made possible, which has conventionally been impossible.

Figure 11:
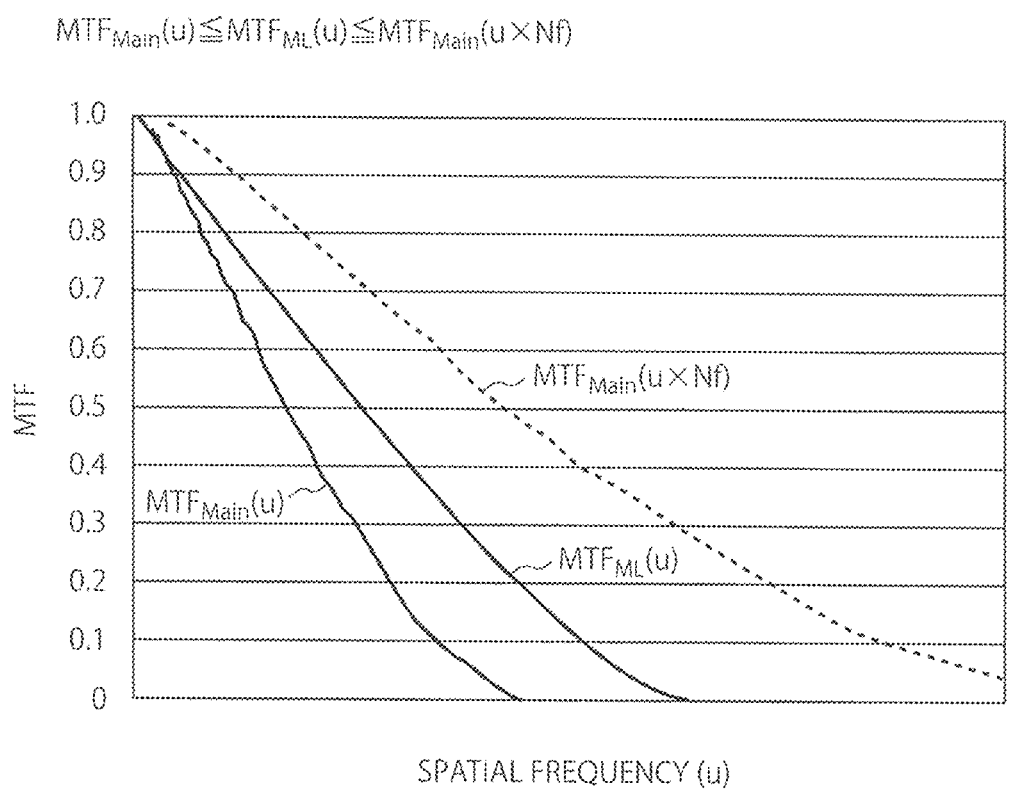
FIG. 11 is a drawing showing the relationship among the image frequencies in the solid state imaging device according to the first embodiment.

FIG. 11 shows the relationship between MTF and the image frequency in the solid state imaging device according to the first embodiment. It is possible to design $MTF_{Main}(u)$ of the main lens to be lower than $MTF_{ML}(u)$ of the microlens. However, in order to set $MTF_{Main}$ after the reduction to be higher than $MTF_{ML}$ of the microlens, the following expression (14) must hold.

$$MTF_{Main}(u) \leq MTF_{ML}(u) \leq MTF_{Main}(u \times Nf) \quad (14)$$

where u denotes the image spatial frequency, and Nf denotes the reduction rate of the microlens.

Figure 24:
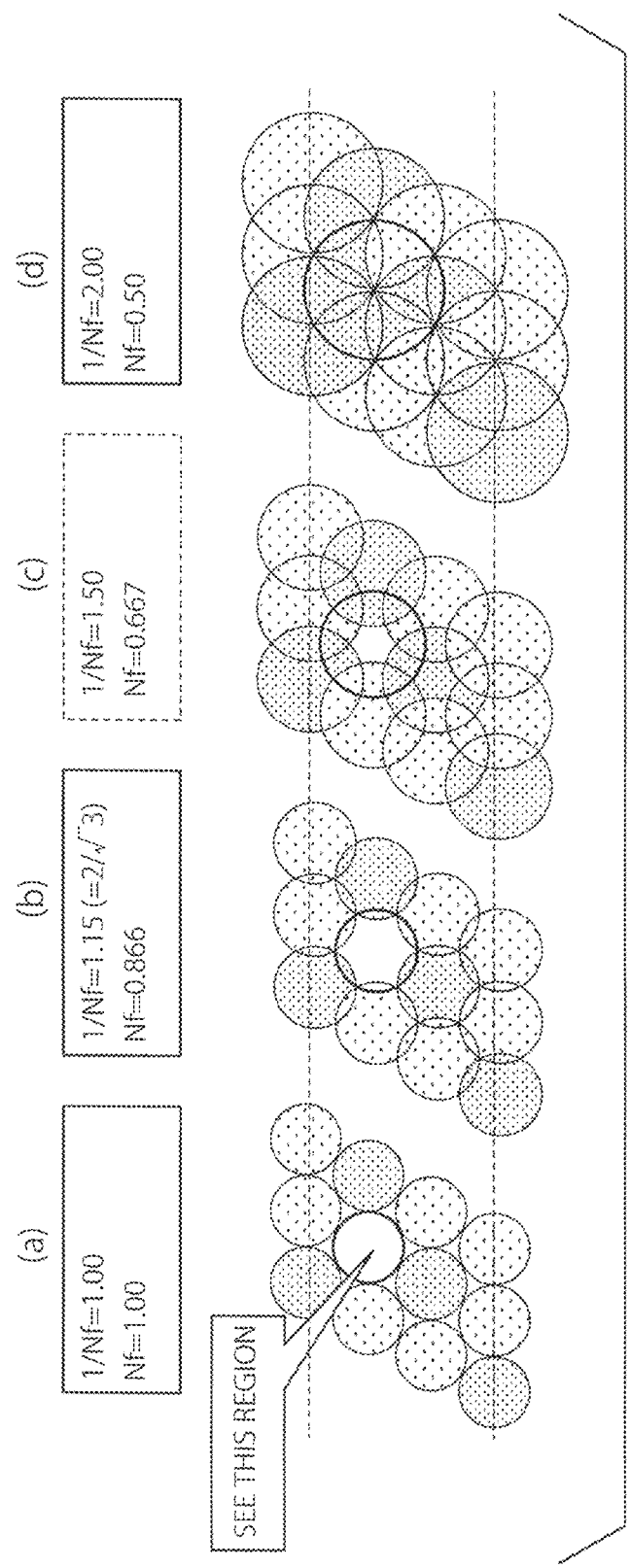
FIGS. 24(a) to 24(d) are drawings showing how images are enlarged and added.

Nf is preferably less than 0.87, and more preferably less than 0.5. The reason for this will be described with reference to FIGS. 24(a) to 24(d). FIGS. 24(a) to 24(d) show the enlargement and the addition of images in the case where the main lens aperture is circular, each microlens image is also circular, and the images are arranged without any gap. The images shown in FIGS. 24(a) to 24(d) correspond to the images of the imaging element 16 shown in FIGS. 4(a) to 4(c). The image plane 70 of FIGS. 4(a) to 4(c) in the case where the images are not reduced by the microlenses is reproduced by reconstruction processing. The ratio in the reconstruction is 1/Nf=1.00 as shown in FIG. 24(a), which is the inverse number of the reduction rate Nf. In this case, however, the images formed on the image plane 70 shown in FIG. 4(a) are not covered by the visual fields of the microlenses by 100%, resulting in that there is a subject region that is not included in the reconstructed image.

The minimum ratio (1/Nf) required so that the microlens visual fields cover the main lens image by 100% as shown in FIG. 24(b) is $2/3^{1/2}(=1.15)$. In this case, the reduction rate Nf is 0.87(=1/1.15).

If the value of 1/Nf is 1.50 as shown in FIG. 24(c), the central portion of each microlens image is imaged only one time. Therefore, the distance of the subject point imaged in the central portion cannot be estimated. However, if the size of the subject is substantially equivalent to (not too smaller than) the size of the microlens image, image matching can be performed based on the pattern of only the periphery portion of the microlens image.

FIG. 24(d) shows the case where the value of 1/Nf is 2.00. In order to image the central portion of the microlens image twice, it is required that the value of 1/Nf be more than 2, i.e., Nf be 0.5 or less.

FIG. 11 shows the case where Nf=0.4. Generally, as the image height increases, the respective aberration values increase. For this reason, it is preferable in the first embodiment that the expression (14) holds for any image height and any wavelength even if the imaging performance of the main lens degrades. For example, the expression (14) should hold in the wavelength range of 380 nm to 780 nm, or in the wavelength range of light passing through the color filters 16c. Specifically, if the color filters 16c include R (red), G (green) and B (blue) color filters, the expression (14) should hold in the wavelength range of more than the peak wavelength of light passing through the B color filters, and less than the peak wavelength of light passing through the R color filters.

The ideal image height meets the conditions of the expression up to 100%, which corresponds to the four corners of the imaging area, when the center of the imaging area (center of the optical axis) is 0%. However, for example, a case is also preferable, where the ratio of the vertical line and the horizontal line of the rectangular of the sensor area is 3:4, and the expression holds for up to 80% of the image height with which the horizontal width of the region is covered since a good characteristic can be exerted in most of the screen.

Furthermore, it is preferable that the wavelength range covers 380 nm to 780 nm to cover the visible light wavelength range.

Incidentally, the aperture of the main lens is preferably in a circular shape, and Nf is preferably 0.001 or more and 0.87 or less in the first embodiment.

The aperture of the main lens is also preferably in a hexagonal shape, and Nf in this case is preferably 0.001 or more and 1 or less. If the aperture of the main lens is in a hexagonal shape, the shape of a microlens image is also in a hexagonal shape. Accordingly, the microlens images are arranged without any space. If such images are expanded even slightly, adjacent images overlap each other. Therefore, the aforementioned partial image matching using the periphery portions of the microlens images can be performed.

(Specific Example of Lens Structure in Optical System of First Embodiment)

Figure 12:
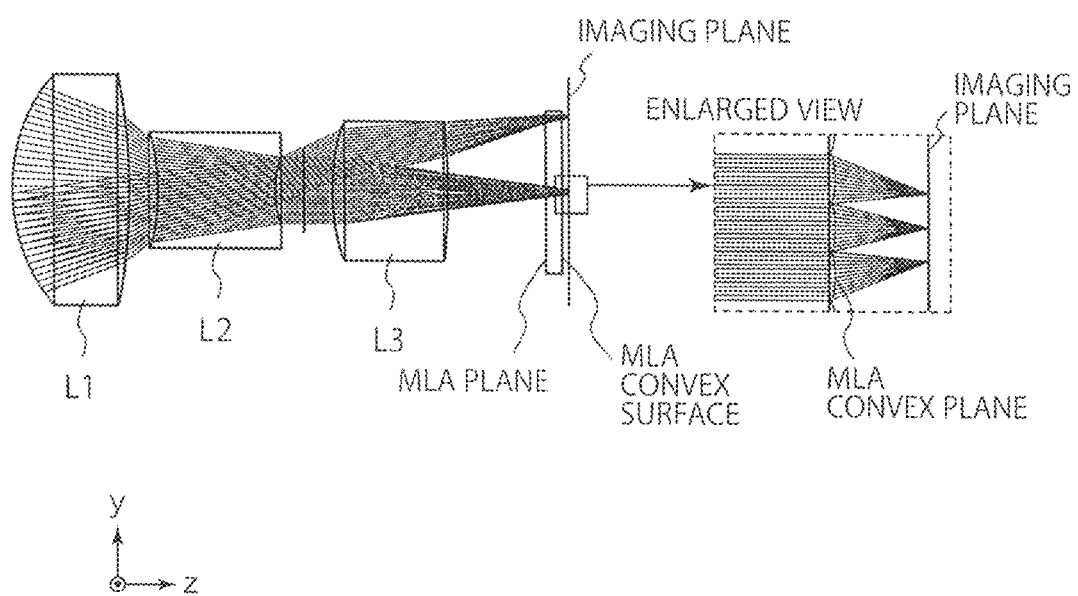
FIG. 12 is a cross-sectional view showing a specific example of the optical system (with MLA) of the first embodiment.

Next, a specific example of the lens structure of the optical system (including the microlens array) according to the first embodiment will be described with reference to FIGS. 12 to 16. As shown in FIG. 12, in this specific example, each lens has a simple three-lens-element in three-group structure (L1, L2, L3), each lens element being a spherical lens. It is assumed that the optical axis direction of the lens is the z-axis direction, and the normal directions relative to the optical axis are the y-axis direction (vertical direction in the drawing) and the x-axis direction (the direction perpendicular to the drawing surface), as shown in FIG. 12. The positive direction on the z-axis is a direction from the left side (subject side) of the main lens group to the right side (image plane). Hereinafter, the lens structure (first lens L1, second lens L2, third lens L3) is expressed by the distance d (mm) between the plane of each element (plane number 1, 2, 3, ...) and the center (z=0) of the lens plane. In this specific example, a microlens array is arranged after the third lens L3 so that the reduction rate becomes Nf=0.5, and a solid-state imaging element such as a CMOS sensor is arranged on the imaging plane. The coordinate z' in the z-axis of the plane shape of the lens element is expressed as $z'=cr^2$ where c is the curvature of each lens plane (1/mm), and r is the distance from the optical axis ($r=(x^2+y^2)^{1/2}$). On the optical axis (r=0), z'=0. Although the curvature etc. of one microlens in the microlens array is shown, in the actual configuration, microlenses shown in FIG. 12 are arranged on a plane (extending in the x direction and the y direction). In FIG. 12, light rays move from the left side (subject side) of the main lens group to the right side (image plane side). Furthermore, FIG. 12 includes an enlarged view of the light rays divided by the microlens array.

FIG. 13 shows examples of numerical values of the specific example. In FIG. 13, $n_d$ denotes the refractive index with respect to the d-line (587.6 nm) of the optical material forming the lens, $v_d$ denotes the Abbe number with respect to the d-line of the material forming the lens, R denotes the effective radius (mm), i.e., the radius of the circular region through which the light rays pass, and f denotes the focal length (mm). In the microlens array, the lenses having the shapes represented by the values in FIG. 13 are arranged on a plane.

Figure 14:
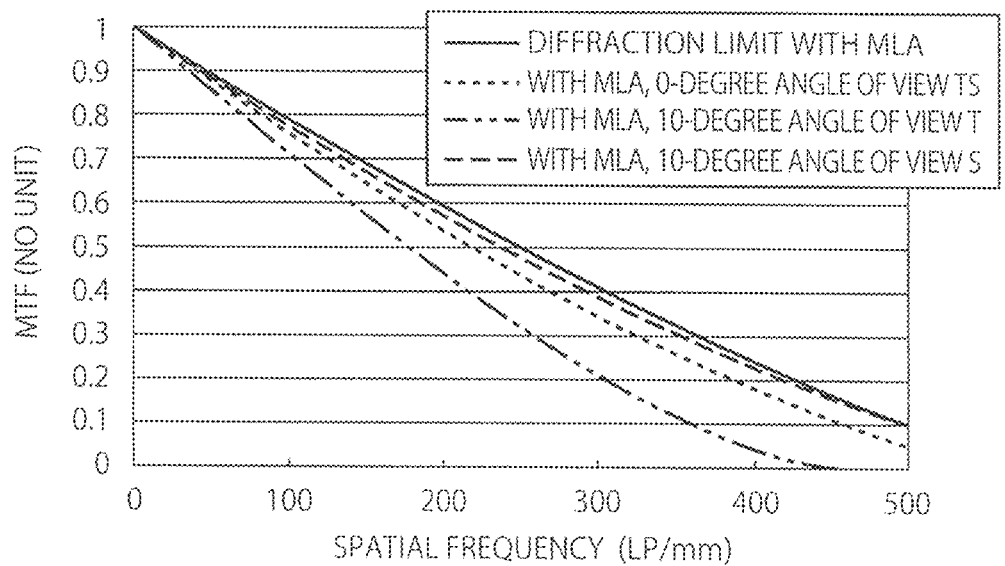
FIG. 14 is a drawing showing the MTF characteristics of the optical system of the specific example.

FIG. 14 shows the white color MTF characteristic of the optical system shown in FIGS. 12 and 13 with the angles of view of 0 degree and 10 degrees. Hereinafter, the MTF characteristic means the value in the white region (MTF obtained with respect to the range of 0.4047 μm-0.6563 μm). The 10-degree angle of view in the tangential plane is expressed by "T," and in the sagittal plane is expressed by "S." As can be understood from FIG. 14, the respective aberrations that could not have been fully corrected by the imaging optical lens (main lens) are reduced in both the vertical direction and the horizontal direction due to the optical image reduction by means of the microlens array in the vertical (z) direction and the horizontal (x, y) directions. Accordingly, at the 0-degree angle of view and the 10-degree angle of view in the sagittal plane (S), the performance substantially reaches the diffraction limit.

Figure 15:
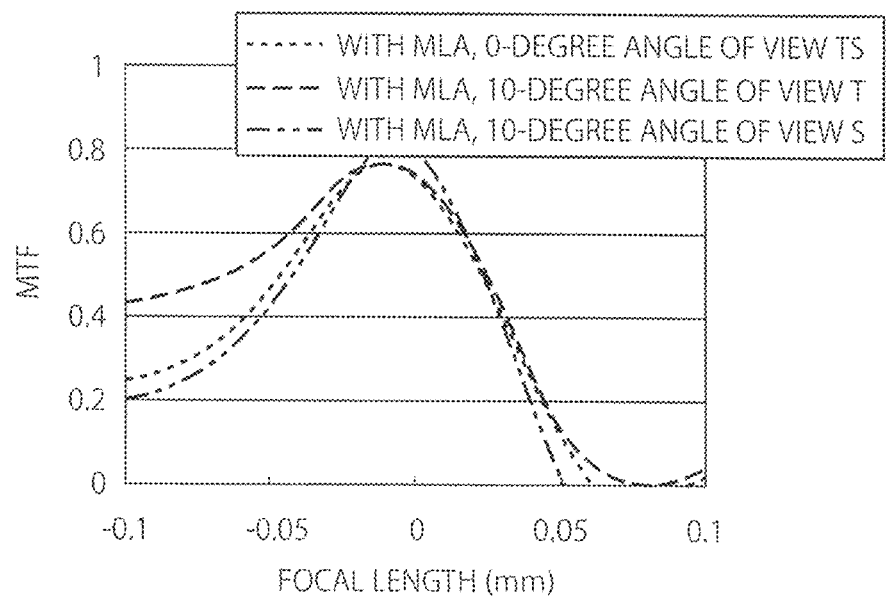
FIG. 15 is a drawing showing the MTF through focus characteristics of the optical system of the specific example.

FIG. 15 shows the MTF through focus characteristic of the optical system shown in FIGS. 12 and 13. The through focus characteristic indicates the change in MTF at a frequency when the imaging plane position (imaging element position) is shifted. FIG. 15 shows the characteristic values at 89 LP/mm (1/4 Nyquist frequency of the pixels with the pitch of 1.4 μm) when the angle of view is 0 degree and 10 degrees.

Figure 16:
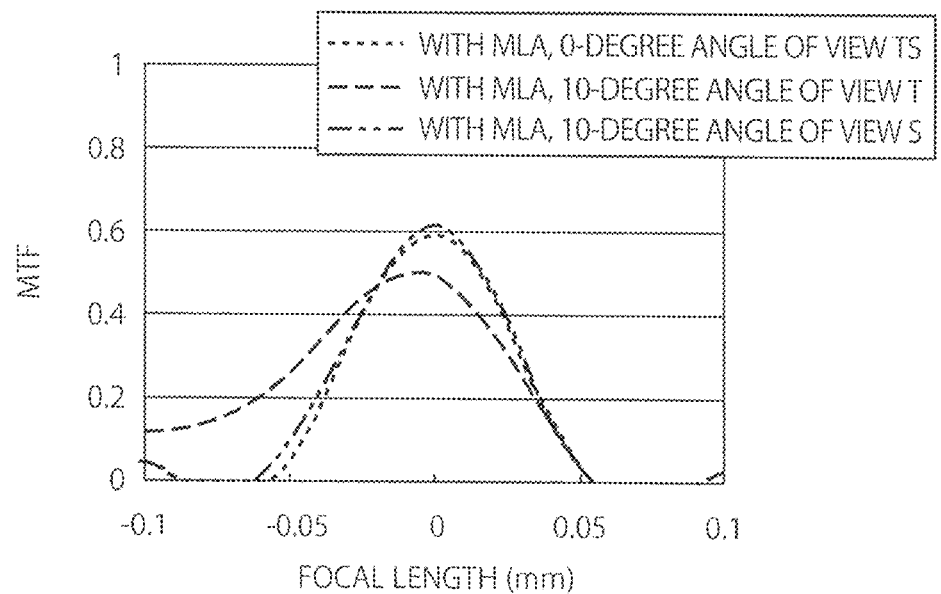
FIG. 16 is a drawing showing the MTF through focus characteristics of the optical system of the specific example.

FIG. 16 also shows the MTF through focus characteristic of the optical system shown in FIGS. 12 and 13. In this case, the characteristic values are at 179 LP/mm (1/2 Nyquist frequency of the pixels with the pitch of 1.4 μm) when the angle of view is 0 degree and 10 degrees.

Comparative Example

Figure 17:
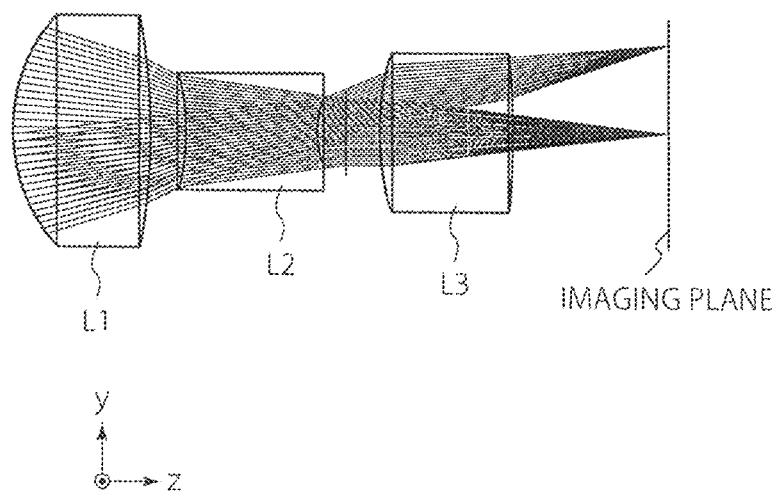
FIG. 17 is a cross-sectional view showing a specific example of an optical system (with MLA) of a comparative example.

FIG. 17 shows an optical system of a comparative example. In the configuration of the optical system of the comparative example, no microlens array is arranged after the third lens of the optical system shown in FIG. 12. Thus, the optical system of the comparative example only has an imaging optical lens (main lens) and does not have any microlens array. Since no microlens array is included, the light rays converge to one point, and form an image there. FIG. 18 shows examples of numerical values of the comparative example.

Figure 19:
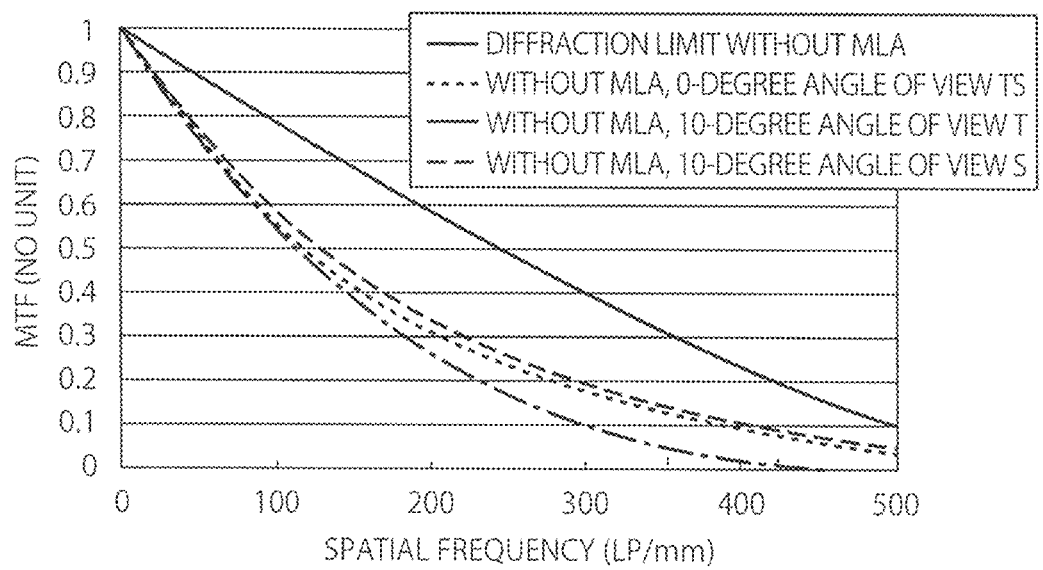
FIG. 19 is a drawing showing the MTF characteristics of the optical system of the comparative example.

Next, FIG. 19 shows the MTF characteristic of the optical system of the comparative example (with no MLA) at the angles of view of 0 degree and 10 degrees. The 10-degree angle of view in the tangential plane is expressed by "T," and in the sagittal plane is expressed by "S." As can be understood from FIG. 19, due to the residual aberrations that could not have been corrected by the imaging optics (main lens), the values of the MTF characteristic are lower than the values of the diffraction limit performance, i.e., lower than the values of the specific example of the first embodiment shown in FIG. 14. From the foregoing, it can be understood that the increase in MTF as shown in FIG. 8 can, be achieved by inserting a microlens array and reducing and re-forming images as in the first embodiment.

Figure 20:
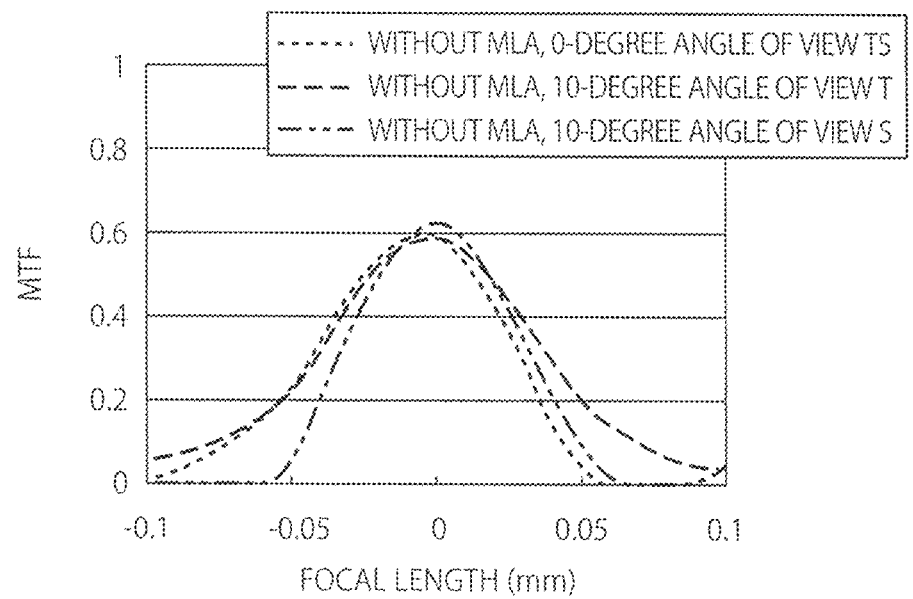
FIG. 20 is a drawing showing the MTF through focus characteristics of the optical system of the comparative example.
Figure 21:
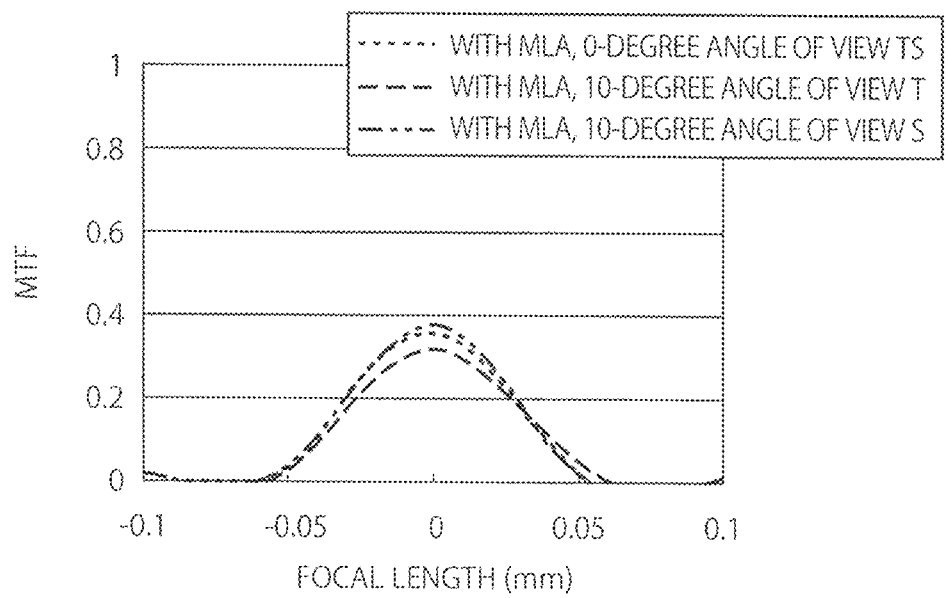
FIG. 21 is a drawing showing the MTF through focus characteristics of the optical system of the comparative example.

Next, FIG. 20 shows the MTF through focus characteristic of the optical system of the comparative example (with no MLA) at 89 LP/mm (1/4 Nyquist frequency of pixels with the pitch of 1.4 μm) when the angle of view is 0 degree and 10 degrees. FIG. 21 also shows the MTF through focus characteristic of the optical system of the comparative example (with no MLA) at 179 LP/mm (1/2 Nyquist frequency of pixels with the pitch of 1.4 μm) when the angle of view is 0 degree and 10 degrees.

As can be understood from the specific example of the first embodiment shown in FIGS. 15 and 16 and the comparative example shown in FIGS. 20 and 21, the MTF values of the comparative example are lower than those of the specific example of the first embodiment. It can also be understood from this that the MTF values can be increased by inserting a microlens array and reducing and re-forming images as in the first embodiment.

As described above, the MTF value at the 1/4 Nyquist frequency (89 LP/mm) for the image height of 0 degree of the specific example of the first embodiment including the microlens array increases from 59% to 79% as compared to the MTF value of the comparative example including the same main lens, and the MTF value at the 1/2 Nyquist frequency (179 LP/mm) increases from 34% to 59%. Such a result is derived from the fact that with the optical and geometric reduction of an image, an aberration is reduced by Nf times in the horizontal direction (x-axis and y-axis directions), and by $Nf^2$ times in the vertical direction (z-axis direction). Accordingly, this result is not limited to the aforementioned specific example, but can be obtained for various lenses with various structures.

Generally, a small lens for portable use requires a relatively wide angle of view, a thinner size (lower profile), and a higher resolution. Accordingly, the number of lens elements tends to increase to correct aberrations and control incident light angle.

However, the optical system according to the first embodiment re-reduces an image by means of the microlens array arranged after the imaging optics (main lens) to increase the image frequency. Accordingly, the main lens does not necessarily have a high frequency image reproducibility like conventional cases, which increases the degree of freedom in design. As a result, the optical system according to the first embodiment can be formed with a lower number of lens elements.

Furthermore, according to the first embodiment, the number of lens elements in optical systems can be reduced, and the degree of freedom in designing the main lens is increased due to the relaxation in requirement of high frequency image reproducibility. Accordingly, a slim design can be made. Moreover, since the light rays from the main lens are converged by the microlenses, the length of the entire optical system can be shortened as compared to the case of the comparative example including only the main lens and the imaging element.

Further, in the optical system according to the first embodiment, the microlenses have a geometric image reduction function with respect to an image formed by the main lens. Accordingly, the optical system has an effect of reducing geometric aberrations. Therefore, it is possible to prevent the increase in aberration on the sensor image plane with the main lens being designed to have a low F#.

As described above, according to the first embodiment, it is possible to provide a solid state imaging device that can be easily designed or manufactured even if the high resolution imaging module is downsized.

Second Embodiment

Figure 22:
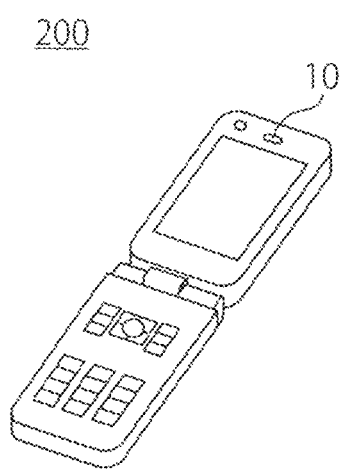
FIG. 22 is a drawing showing a portable information terminal according to the second embodiment.

Next, FIG. 22 shows a portable information terminal according to the second embodiment. The portable information terminal 200 according to the second embodiment includes the solid state imaging device according to the first embodiment. The portable information terminal shown in FIG. 22 is just an example, and the reference numeral 10 denotes the imaging module of the solid state imaging device according to the first embodiment.

The solid state imaging device of the first embodiment can be applied not only to portable information terminals but also to still cameras.

According to the second embodiment, it is possible to provide a portable information terminal that can be designed or manufactured easily even if the high resolution imaging module is downsized.

Third Embodiment

Figure 23:
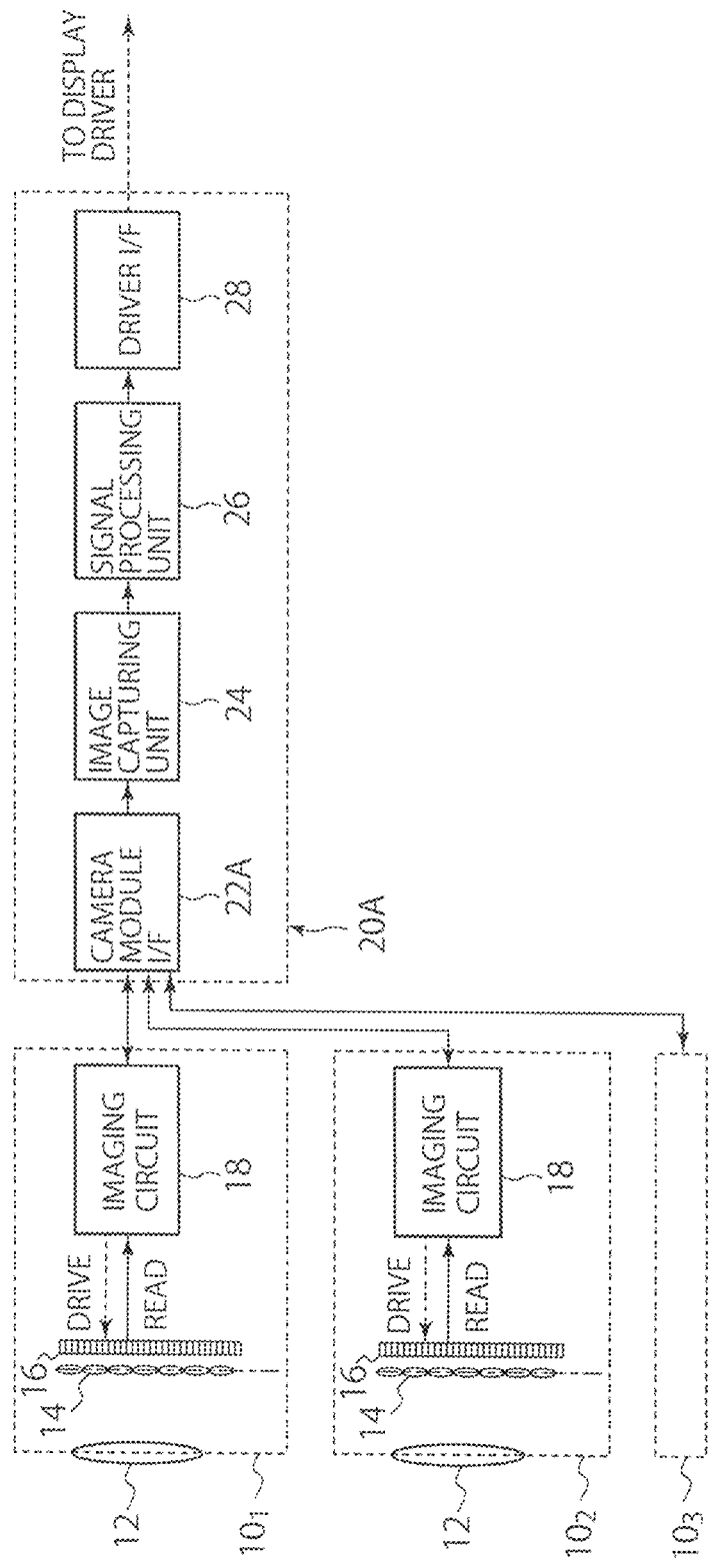
FIG. 23 is a solid state imaging system according to the third embodiment.

FIG. 23 shows a solid state imaging system according to the third embodiment. The solid state imaging system according to the third embodiment includes a plurality of imaging module units $10_1$-$10_m$ and an imaging signal processor (ISP) 20A.

Each imaging module unit $10_i$ (i=1, ... , m) has a configuration identical with the configuration of the imaging module unit 10 of the first embodiment. Specifically, each imaging module unit $10_i$ (i=1, ... , m) includes an imaging optics 12, a microlens array 14, an imaging element 16, and an imaging circuit 18.

The IPS 20A has a configuration obtained by replacing the camera module interface (I/F) 22 of the IPS 20 in the first embodiment with a camera module interface (I/F) 22A. Specifically, the ISP 20A includes the camera module I/F 22A, an image capturing unit 24, a signal processing unit 26, and a driver I/F 28. A RAW image taken by each imaging module unit $10_i$ (i=1, ... , m) is captured via the camera module I/F 22A to the image capturing unit 24. The signal processing unit 26 performs a signal processing operation on the RAW image captured by the image capturing unit 24. The driver I/F 28 outputs image signals having been subjected to the signal processing performed by the signal processing unit 26 to a display driver that is not shown in FIG. 23. The display driver displays the image formed by the solid state imaging device. Thus, the IPS 20A controls the imaging module units $10_1$-$10_3$ to capture RAW images taken by each imaging module units $10_i$ (i=1, ... , m) and performs image processing thereon.

With such a configuration, it is possible to obtain distance information either by using a single imaging module, e.g., imaging module unit $10_1$, or by performing stereo measurement using two or more imaging modules. The accuracy of distance information can be improved by, for example, obtaining distance information in a short distance or narrow area with a single module, and distance information in a long distance by performing measurement using two or more imaging modules.

Since no light source is used in the third embodiment, no interference among light sources occurs as compared to a distance imaging camera using a reference light source. Accordingly, it is possible to make a system including several imaging modules operating together.

As in the case of the first embodiment, the optical system according to the third embodiment re-reduces an image with the microlens array arranged after the imaging optics (main lens) to increase the image frequency. Accordingly, the main lens is not required to have high frequency image reproducibility as in the conventional cases. This improves the degree of freedom in design. As a result, the optical system can be formed with a lower number of lens elements.

Furthermore, as in the first embodiment, the number of lens elements of each lens in the optical system according to the third embodiment can be reduced, and the requirement of high-frequency image reproducibility is relaxed, which improves the degree of freedom in designing the main lens. As a result, a slim design can be made. Moreover, since the light rays from the main lens are converged by means of the microlenses, the entire length of the optical system can be shortened as compared to an optical system including only a main lens and an imaging element like the comparative example.

Further, as in the first embodiment, the microlens in the third embodiment has a geometric image-reducing function on an image formed by the main lens, which provides an effect of reducing geometric aberrations. It is therefore possible to prevent an increase in aberration on the sensor image plane while designing the main lens to have a low F#.

As described above, according to the third embodiment, it is possible to provide a solid state imaging system capable of being designed or manufactured even if the high resolution imaging module is downsized, like the first embodiment.

Thus, according to the respective embodiments, it is possible to make more compact and thinner an imaging device capable of obtaining a visible image and a depth image at a time with a single device. The downsizing of the device makes it possible to mount the device on various apparatuses, which contributes to the downsizing of such products as portable information terminals and home appliances.

Furthermore, it is possible to apply the embodiments to the machine vision region where the devices are implemented in various types of industrial robots, robot arms, and endoscopes, which should be lower in power consumption, smaller in size and lighter in weight.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. An imaging device comprising:
   an imaging element including pixels;
   a lens; and
   a microlens array including microlenses, the microlens array reducing an image to be formed on an imaging plane of the lens by Nf times or less,
   the imaging device meeting conditions of an expression $$MTF_{Main}(u) \leq MTF_{ML}(u) \leq MTF_{Main}(u \times Nf)$$

where u denotes an image spatial frequency, $MTF_{ML}(u)$ denotes an MTF function of the microlenses, and $MTF_{Main}(u)$ denotes an MTF function of the lens.

2. The device according to claim 1, wherein the shape of an aperture of the lens is circular, and the Nf is 0.001 or more and 0.87 or less.

3. The device according to claim 1, wherein the shape of an aperture of the lens is hexagonal, and the Nf is 0.001 or more and 1 or less.

4. The device according to claim 1, wherein the conditions of the expression $$MTF_{Main}(u) \leq MTF_{ML}(u) \leq MTF_{Main}(u \times Nf)$$

are met in a wavelength range of 380 nm to 780 nm.

5. A portable information terminal including the device according to claim 1.

6. The terminal according to claim 5, wherein the shape of an aperture of the lens is circular, and the Nf is 0.001 or more and 0.87 or less.

7. The terminal according to claim 5, wherein the shape of an aperture of the lens is hexagonal, and the Nf is 0.001 or more and 1 or less.

8. The terminal according to claim 5, wherein the conditions of the expression $$MTF_{Main}(u) \leq MTF_{ML}(u) \leq MTF_{Main}(u \times Nf)$$

are met in a wavelength range of 380 nm to 780 nm.

9. An imaging system comprising:
   two or more imaging modules, each imaging module including:
      an imaging element including pixels;
      a lens;
      a microlens array including microlenses, the microlens array reducing an image to be formed on an imaging plane of the lens by Nf times or less; and
   each imaging module meeting conditions of an expression $$MTF_{Main}(u) \leq MTF_{ML}(u) \leq MTF_{Main}(u \times Nf)$$

where u denotes an image spatial frequency, $MTF_{ML}(u)$ denotes an MTF function of the microlenses, and $MTF_{Main}(u)$ denotes an MTF function of the lens; and
      a control circuit controlling the imaging modules to capture images taken by the imaging modules to perform an image processing operation.

10. The system according to claim 9, wherein the shape of an aperture of the lens is circular, and the Nf is 0.001 or more and 0.87 or less.

11. The system according to claim 9, wherein the shape of an aperture of the lens is hexagonal, and the Nf is 0.001 or more and 1 or less.

12. The system according to claim 9, wherein the conditions of the expression $$MTF_{Main}(u) \leq MTF_{ML}(u) \leq MTF_{Main}(u \times Nf)$$

are met in a wavelength range of 380 nm to 780 nm.

* * * * *